United States Patent
Langdo et al.

(10) Patent No.: US 7,439,164 B2
(45) Date of Patent: Oct. 21, 2008

(54) METHODS OF FABRICATING SEMICONDUCTOR STRUCTURES HAVING EPITAXIALLY GROWN SOURCE AND DRAIN ELEMENTS

(75) Inventors: Thomas A. Langdo, Cambridge, MA (US); Anthony J. Lochtefeld, Somerville, MA (US)

(73) Assignee: AmberWave Systems Corporation, Salem, NH (US)

( * ) Notice: Subject to any disclaimer, the term of this patent is extended or adjusted under 35 U.S.C. 154(b) by 0 days.

(21) Appl. No.: 11/489,787

(22) Filed: Jul. 20, 2006

(65) Prior Publication Data

US 2006/0258125 A1    Nov. 16, 2006

Related U.S. Application Data

(63) Continuation of application No. 11/103,681, filed on Apr. 12, 2005, now Pat. No. 7,122,449, which is a continuation of application No. 10/458,544, filed on Jun. 10, 2003, now Pat. No. 6,946,371.

(60) Provisional application No. 60/387,867, filed on Jun. 10, 2002.

(51) Int. Cl.
   *H01L 21/20* (2006.01)
   *H01L 21/36* (2006.01)

(52) U.S. Cl. ...................... 438/481; 438/504

(58) Field of Classification Search .............. 438/481, 438/504, 505; 257/E21.131, E21.171, E21.43, 257/E21.438
   See application file for complete search history.

(56) References Cited

U.S. PATENT DOCUMENTS 4,010,045 A    3/1977    Ruehrwein
4,522,662 A    6/1985    Bradbury et al.

(Continued)

FOREIGN PATENT DOCUMENTS

DE    41 01 167    7/1992

(Continued)

OTHER PUBLICATIONS

D.C. Ahlgren et al.,"A SiGe HBT BICMOS Technology for Mixed-Signal RF Applications", 1997 IEEE Bipolar/BiMOS Circuites and Tech Meeting 195.

(Continued)

*Primary Examiner*—Fernando L Toledo
(74) *Attorney, Agent, or Firm*—Goodwin Procter LLP

(57) ABSTRACT

Methods for fabricating facetless semiconductor structures using commercially available chemical vapor deposition systems are disclosed herein. A key aspect of the invention includes selectively depositing an epitaxial layer of at least one semiconductor material on the semiconductor substrate while in situ doping the epitaxial layer to suppress facet formation. Suppression of faceting during selective epitaxial growth by in situ doping of the epitaxial layer at a predetermined level rather than by manipulating spacer composition and geometry alleviates the stringent requirements on the device design and increases tolerance to variability during the spacer fabrication.

23 Claims, 5 Drawing Sheets

U.S. PATENT DOCUMENTS

| | | |
|---|---|---|
| 4,649,859 A | 3/1987 | Wanlass |
| 4,710,788 A | 12/1987 | Dambkes et al. |
| 4,717,681 A | 1/1988 | Curran |
| 4,749,441 A | 6/1988 | Christenson et al. |
| 4,755,478 A | 7/1988 | Abernathey et al. |
| 4,786,615 A | 11/1988 | Liaw et al. |
| 4,803,539 A | 2/1989 | Psaras et al. |
| 4,857,986 A | 8/1989 | Kinugawa |
| 4,963,506 A | 10/1990 | Liaw et al. |
| 4,969,031 A | 11/1990 | Kobayashi et al. |
| 4,987,462 A | 1/1991 | Kim et al. |
| 4,990,979 A | 2/1991 | Otto |
| 4,997,776 A | 3/1991 | Harame et al. |
| 5,013,681 A | 5/1991 | Godbey et al. |
| 5,034,348 A | 7/1991 | Hartswick et al. |
| 5,089,872 A | 2/1992 | Ozturk et al. |
| 5,091,767 A | 2/1992 | Bean et al. |
| 5,108,946 A | 4/1992 | Zdebel et al. |
| 5,155,571 A | 10/1992 | Wang et al. |
| 5,166,084 A | 11/1992 | Pfiester |
| 5,177,583 A | 1/1993 | Endo et al. |
| 5,198,689 A | 3/1993 | Fujioka |
| 5,202,284 A | 4/1993 | Kamins et al. |
| 5,207,864 A | 5/1993 | Bhat et al. |
| 5,208,182 A | 5/1993 | Narayan et al. |
| 5,212,110 A | 5/1993 | Pfiester et al. |
| 5,212,112 A | 5/1993 | Lynch |
| 5,217,923 A | 6/1993 | Suguro |
| 5,221,413 A | 6/1993 | Brasen et al. |
| 5,225,703 A | 7/1993 | Nakatami |
| 5,240,876 A | 8/1993 | Gaul et al. |
| 5,241,197 A | 8/1993 | Murakami et al. |
| 5,242,847 A | 9/1993 | Ozturk et al. |
| 5,243,207 A | 9/1993 | Plumton et al. |
| 5,250,445 A | 10/1993 | Bean et al. |
| 5,285,086 A | 2/1994 | Fitzgerald |
| 5,291,439 A | 3/1994 | Kauffmann et al. |
| 5,294,564 A | 3/1994 | Karapiperis et al. |
| 5,298,452 A | 3/1994 | Meyerson |
| 5,304,834 A | 4/1994 | Lynch |
| 5,310,451 A | 5/1994 | Tejwani et al. |
| 5,316,958 A | 5/1994 | Meyerson |
| 5,334,861 A | 8/1994 | Pfiester et al. |
| 5,336,903 A | 8/1994 | Ozturk et al. |
| 5,346,840 A | 9/1994 | Fujioka |
| 5,346,848 A | 9/1994 | Grupen-Shemansky et al. |
| 5,374,564 A | 12/1994 | Bruel |
| 5,399,522 A | 3/1995 | Ohori |
| 5,413,679 A | 5/1995 | Godbey |
| 5,424,243 A | 6/1995 | Takasaki |
| 5,426,069 A | 6/1995 | Selvakumar et al. |
| 5,426,316 A | 6/1995 | Mohammad |
| 5,442,205 A | 8/1995 | Brasen et al. |
| 5,461,243 A | 10/1995 | Ek et al. |
| 5,461,250 A | 10/1995 | Burghartz et al. |
| 5,462,883 A | 10/1995 | Dennard et al. |
| 5,476,813 A | 12/1995 | Naruse |
| 5,479,033 A | 12/1995 | Baca et al. |
| 5,484,664 A | 1/1996 | Kitahara et al. |
| 5,496,750 A | 3/1996 | Moslehi |
| 5,496,771 A | 3/1996 | Cronin et al. |
| 5,523,243 A | 6/1996 | Mohammad |
| 5,523,592 A | 6/1996 | Nakagawa et al. |
| 5,534,713 A | 7/1996 | Ismail et al. |
| 5,536,361 A | 7/1996 | Kondo et al. |
| 5,540,785 A | 7/1996 | Dennard et al. |
| 5,571,373 A | 11/1996 | Krishna et al. |
| 5,572,043 A | 11/1996 | Shimizu et al. |
| 5,596,527 A | 1/1997 | Tomioka et al. |
| 5,617,351 A | 4/1997 | Bertin et al. |
| 5,630,905 A | 5/1997 | Lynch et al. |
| 5,633,202 A | 5/1997 | Brigham et al. |
| 5,659,187 A | 8/1997 | Legoues et al. |
| 5,659,194 A | 8/1997 | Iwamatsu et al. |
| 5,683,934 A | 11/1997 | Candelaria |
| 5,698,869 A | 12/1997 | Yoshimi et al. |
| 5,710,450 A | 1/1998 | Chau et al. |
| 5,714,413 A | 2/1998 | Brigham et al. |
| 5,714,777 A | 2/1998 | Ismail et al. |
| 5,728,623 A | 3/1998 | Mori |
| 5,739,567 A | 4/1998 | Wong |
| 5,759,898 A | 6/1998 | Ek et al. |
| 5,777,347 A | 7/1998 | Bartelink |
| 5,786,612 A | 7/1998 | Otani et al. |
| 5,786,614 A | 7/1998 | Chuang et al. |
| 5,792,679 A | 8/1998 | Nakato |
| 5,808,344 A | 9/1998 | Ismail et al. |
| 5,821,577 A | 10/1998 | Crabbe' et al. |
| 5,844,260 A | 12/1998 | Ohori |
| 5,847,419 A | 12/1998 | Imai et al. |
| 5,869,359 A | 2/1999 | Prabhakar |
| 5,876,796 A | 3/1999 | Regolini et al. |
| 5,877,070 A | 3/1999 | Goesele et al. |
| 5,877,535 A | 3/1999 | Matsumoto |
| 5,891,769 A | 4/1999 | Liaw et al. |
| 5,906,708 A | 5/1999 | Robinson et al. |
| 5,906,951 A | 5/1999 | Chu et al. |
| 5,912,479 A | 6/1999 | Mori et al. |
| 5,933,741 A | 8/1999 | Tseng |
| 5,943,560 A | 8/1999 | Chang et al. |
| 5,963,817 A | 10/1999 | Chu et al. |
| 5,966,622 A | 10/1999 | Levine et al. |
| 5,976,939 A | 11/1999 | Thompson et al. |
| 5,998,807 A | 12/1999 | Lustig et al. |
| 6,008,111 A | 12/1999 | Fushida et al. |
| 6,013,134 A | 1/2000 | Chu et al. |
| 6,030,887 A | 2/2000 | Desai et al. |
| 6,030,889 A | 2/2000 | Aulicino et al. |
| 6,033,974 A | 3/2000 | Henley et al. |
| 6,033,995 A | 3/2000 | Muller |
| 6,058,044 A | 5/2000 | Sugiura et al. |
| 6,059,895 A | 5/2000 | Chu et al. |
| 6,066,563 A | 5/2000 | Nagashima |
| 6,074,919 A | 6/2000 | Gardner et al. |
| 6,096,590 A | 8/2000 | Chan et al. |
| 6,096,647 A | 8/2000 | Yang et al. |
| 6,103,559 A | 8/2000 | Gardner et al. |
| 6,107,653 A | 8/2000 | Fitzgerald |
| 6,111,267 A | 8/2000 | Fischer et al. |
| 6,117,750 A | 9/2000 | Bensahel et al. |
| 6,121,100 A | 9/2000 | Andideh et al. |
| 6,130,453 A | 10/2000 | Mei et al. |
| 6,132,806 A | 10/2000 | Dutartre |
| 6,133,124 A | 10/2000 | Horstmann et al. |
| 6,133,799 A | 10/2000 | Favors, Jr. et al. |
| 6,140,687 A | 10/2000 | Shimomura et al. |
| 6,143,636 A | 11/2000 | Forbes et al. |
| 6,153,495 A | 11/2000 | Kub et al. |
| 6,154,475 A | 11/2000 | Soref et al. |
| 6,159,852 A | 12/2000 | Nuttall et al. |
| 6,159,856 A | 12/2000 | Nagano |
| 6,160,303 A | 12/2000 | Fattaruso |
| 6,162,688 A | 12/2000 | Gardner et al. |
| 6,184,111 B1 | 2/2001 | Henley et al. |
| 6,187,657 B1 | 2/2001 | Xiang et al. |
| 6,191,007 B1 | 2/2001 | Matsui et al. |
| 6,191,432 B1 | 2/2001 | Sugiyama et al. |
| 6,194,722 B1 | 2/2001 | Fiorini et al. |
| 6,204,529 B1 | 3/2001 | Lung et al. |
| 6,207,977 B1 | 3/2001 | Augusto |
| 6,210,988 B1 | 4/2001 | Howe et al. |
| 6,214,679 B1 | 4/2001 | Murthy et al. |
| 6,218,677 B1 | 4/2001 | Broekaert |
| 6,228,694 B1 | 5/2001 | Doyle et al. |

| | | |
|---|---|---|
| 6,232,138 B1 | 5/2001 | Fitzgerald et al. |
| 6,235,567 B1 | 5/2001 | Huang |
| 6,235,568 B1 | 5/2001 | Murthy et al. |
| 6,235,575 B1 | 5/2001 | Kasai et al. |
| 6,242,324 B1 | 6/2001 | Kub et al. |
| 6,242,327 B1 | 6/2001 | Yokoyama et al. |
| 6,246,077 B1 | 6/2001 | Kobayashi et al. |
| 6,249,022 B1 | 6/2001 | Lin et al. |
| 6,251,755 B1 | 6/2001 | Furukawa et al. |
| 6,251,780 B1 | 6/2001 | Sohn et al. |
| 6,261,929 B1 | 7/2001 | Gehrke et al. |
| 6,266,278 B1 | 7/2001 | Harari et al. |
| 6,268,257 B1 | 7/2001 | Wieczorek et al. |
| 6,271,551 B1 | 8/2001 | Schmitz et al. |
| 6,271,726 B1 | 8/2001 | Fransis et al. |
| 6,281,532 B1 | 8/2001 | Doyle et al. |
| 6,291,321 B1 | 9/2001 | Fitzgerald |
| 6,294,448 B1 | 9/2001 | Chang et al. |
| 6,306,698 B1 | 10/2001 | Wieczorek et al. |
| 6,313,016 B1 | 11/2001 | Kibbel et al. |
| 6,313,486 B1 | 11/2001 | Kencke et al. |
| 6,315,384 B1 | 11/2001 | Ramaswami et al. |
| 6,316,301 B1 | 11/2001 | Kant |
| 6,316,357 B1 | 11/2001 | Lin et al. |
| 6,319,799 B1 | 11/2001 | Ouyang et al. |
| 6,319,805 B1 | 11/2001 | Iwamatsu et al. |
| 6,323,108 B1 | 11/2001 | Kub et al. |
| 6,326,281 B1 | 12/2001 | Violette et al. |
| 6,326,664 B1 | 12/2001 | Chau et al. |
| 6,329,063 B2 | 12/2001 | Lo et al. |
| 6,335,546 B1 | 1/2002 | Tsuda et al. |
| 6,339,232 B1 | 1/2002 | Takagi |
| 6,342,421 B1 | 1/2002 | Mitani et al. |
| 6,344,375 B1 | 2/2002 | Orita et al. |
| 6,350,311 B1 | 2/2002 | Chin et al. |
| 6,350,993 B1 | 2/2002 | Chu et al. |
| 6,352,909 B1 | 3/2002 | Usenko |
| 6,362,071 B1 | 3/2002 | Nguyen et al. |
| 6,368,733 B1 | 4/2002 | Nishinaga |
| 6,368,927 B1 | 4/2002 | Lee |
| 6,369,438 B1 | 4/2002 | Sugiyama et al. |
| 6,372,356 B1 | 4/2002 | Thornton et al. |
| 6,372,593 B1 | 4/2002 | Hattori et al. |
| 6,376,318 B1 | 4/2002 | Lee et al. |
| 6,380,008 B2 | 4/2002 | Kwok et al. |
| 6,391,798 B1 | 5/2002 | DeFelice et al. |
| 6,399,970 B2 | 6/2002 | Kubo et al. |
| 6,403,975 B1 | 6/2002 | Brunner et al. |
| 6,406,973 B1 | 6/2002 | Lee |
| 6,406,986 B1 | 6/2002 | Yu |
| 6,407,406 B1 | 6/2002 | Tezuka |
| 6,410,371 B1 | 6/2002 | Yu et al. |
| 6,420,937 B1 | 7/2002 | Akatsuka et al. |
| 6,425,951 B1 | 7/2002 | Chu et al. |
| 6,429,061 B1 | 8/2002 | Rim |
| 6,444,578 B1 | 9/2002 | Cabral, Jr. et al. |
| 6,455,894 B1 | 9/2002 | Matsumoto et al. |
| 6,461,960 B2 | 10/2002 | Lee |
| 6,486,520 B2 | 11/2002 | Okuno et al. |
| 6,492,216 B1 | 12/2002 | Yeo et al. |
| 6,498,359 B2 | 12/2002 | Schmidt et al. |
| 6,503,833 B1 | 1/2003 | Ajmera et al. |
| 6,509,587 B2 | 1/2003 | Sugiyama et al. |
| 6,521,041 B2 | 2/2003 | Wu et al. |
| 6,521,508 B1 | 2/2003 | Cheone et al. |
| 6,524,935 B1 | 2/2003 | Canaperi et al. |
| 6,555,839 B2 | 4/2003 | Fitzgerald |
| 6,555,880 B2 | 4/2003 | Cabral, Jr. et al. |
| 6,562,703 B1 | 5/2003 | Maa et al. |
| 6,563,152 B2 | 5/2003 | Roberds et al. |
| 6,566,718 B2 | 5/2003 | Wieczorek et al. |
| 6,573,126 B2 | 6/2003 | Cheng et al. |
| 6,573,160 B2 | 6/2003 | Taylor, Jr. et al. |
| 6,583,015 B2 | 6/2003 | Fitzgerald et al. |
| 6,591,321 B1 | 7/2003 | Arimilli et al. |
| 6,593,191 B2 | 7/2003 | Fitzgerald |
| 6,593,641 B1 | 7/2003 | Fitzergald |
| 6,597,016 B1 | 7/2003 | Yuki et al. |
| 6,602,613 B1 | 8/2003 | Fitzgerald |
| 6,603,156 B2 | 8/2003 | Rim |
| 6,605,498 B1 | 8/2003 | Murthy et al. |
| 6,607,948 B1 | 8/2003 | Sugiyama et al. |
| 6,621,131 B2 | 9/2003 | Murthy et al. |
| 6,624,478 B2 | 9/2003 | Anderson et al. |
| 6,646,322 B2 | 11/2003 | Fitzgerald |
| 6,649,480 B2 | 11/2003 | Fitzgerald et al. |
| 6,657,223 B1 | 12/2003 | Wang et al. |
| 6,674,150 B2 | 1/2004 | Takagi et al. |
| 6,677,192 B1 | 1/2004 | Fitzgerald |
| 6,682,965 B1 | 1/2004 | Noguchi et al. |
| 6,686,617 B2 | 2/2004 | Agnello et al. |
| 6,690,043 B1 | 2/2004 | Usuda et al. |
| 6,699,765 B1 | 3/2004 | Shideler et al. |
| 6,703,144 B2 | 3/2004 | Fitzgerald |
| 6,703,271 B2 | 3/2004 | Yeo et al. |
| 6,703,648 B1 | 3/2004 | Xiang et al. |
| 6,703,688 B1 | 3/2004 | Fitzgerald |
| 6,709,903 B2 | 3/2004 | Christiansen et al. |
| 6,709,929 B2 | 3/2004 | Zhang et al. |
| 6,713,326 B2 | 3/2004 | Cheng et al. |
| 6,723,661 B2 | 4/2004 | Fitzergald |
| 6,724,008 B2 | 4/2004 | Fitzergald |
| 6,724,019 B2 | 4/2004 | Oda et al. |
| 6,730,551 B2 | 5/2004 | Lee et al. |
| 6,737,670 B2 | 5/2004 | Cheng et al. |
| 6,743,651 B2 | 6/2004 | Chu et al. |
| 6,743,684 B2 | 6/2004 | Liu |
| 6,750,130 B1 | 6/2004 | Fitzgerald |
| 6,764,908 B1 | 7/2004 | Kadosh et al. |
| 6,787,864 B2 | 9/2004 | Paton et al. |
| 6,797,571 B2 | 9/2004 | Nagaoka et al. |
| 6,812,086 B2 | 11/2004 | Murthy et al. |
| 6,818,537 B2 | 11/2004 | Cheong |
| 6,818,938 B1 | 11/2004 | Naem |
| 6,825,086 B2 | 11/2004 | Lee et al. |
| 6,828,632 B2 | 12/2004 | Bhattacharyya |
| 6,830,976 B2 | 12/2004 | Fitzgerald |
| 6,855,649 B2 | 2/2005 | Christiansen et al. |
| 6,855,990 B2 | 2/2005 | Hu et al. |
| 6,861,318 B2 | 3/2005 | Murthy et al. |
| 6,876,053 B1 | 4/2005 | Ma et al. |
| 6,881,630 B2 | 4/2005 | Song et al. |
| 6,885,084 B2 | 4/2005 | Murthy et al. |
| 6,887,762 B1 | 5/2005 | Murthy et al. |
| 6,887,773 B2 | 5/2005 | Gunn, III et al. |
| 6,900,103 B2 | 5/2005 | Fitzgerald |
| 6,909,186 B2 | 6/2005 | Chu |
| 6,929,992 B1 | 8/2005 | Djomehri et al. |
| 6,933,518 B2 | 8/2005 | Braithwaite et al. |
| 6,936,509 B2 | 8/2005 | Coolbaugh et al. |
| 6,940,089 B2 | 9/2005 | Cheng et al. |
| 6,946,371 B2 | 9/2005 | Langdo et al. |
| 6,953,972 B2 | 10/2005 | Yeo et al. |
| 6,974,733 B2 | 12/2005 | Boyanov et al. |
| 6,982,433 B2 | 1/2006 | Hoffman et al. |
| 6,982,474 B2 | 1/2006 | Currie et al. |
| 6,992,355 B2 | 1/2006 | Mouli |
| 6,995,430 B2 | 2/2006 | Langdo et al. |
| 7,091,520 B2 | 8/2006 | Nakajima et al. |
| 2001/0001724 A1 | 5/2001 | Kwok et al. |
| 2001/0003269 A1 | 6/2001 | Wu et al. |
| 2001/0003364 A1 | 6/2001 | Sugawara et al. |
| 2001/0009303 A1 | 7/2001 | Tang et al. |
| 2001/0031535 A1 | 10/2001 | Agnello et al. |
| 2001/0045604 A1 | 11/2001 | Oda et al. |
| 2002/0001948 A1 | 1/2002 | Lee |

| | | |
|---|---|---|
| 2002/0019127 A1 | 2/2002 | Givens |
| 2002/0024395 A1 | 2/2002 | Akatsuka et al. |
| 2002/0043660 A1 | 4/2002 | Yamazaki et al. |
| 2002/0048910 A1 | 4/2002 | Taylor, Jr. et al. |
| 2002/0052084 A1 | 5/2002 | Fitzgerald |
| 2002/0056879 A1 | 5/2002 | Wieczorek et al. |
| 2002/0063292 A1 | 5/2002 | Armstrong et al. |
| 2002/0068393 A1 | 6/2002 | Fitzgerald et al. |
| 2002/0072130 A1 | 6/2002 | Cheng et al. |
| 2002/0084000 A1 | 7/2002 | Fitzgerald |
| 2002/0096717 A1 | 7/2002 | Chu et al. |
| 2002/0100942 A1 | 8/2002 | Fitzgerald et al. |
| 2002/0123167 A1 | 9/2002 | Fitzgerald |
| 2002/0123182 A1 | 9/2002 | Rabkin et al. |
| 2002/0123183 A1 | 9/2002 | Fitzgerald |
| 2002/0123197 A1 | 9/2002 | Fitzgerald et al. |
| 2002/0125471 A1 | 9/2002 | Fitzgerald et al. |
| 2002/0125497 A1 | 9/2002 | Fitzgerald |
| 2002/0140031 A1 | 10/2002 | Rim |
| 2002/0168864 A1 | 11/2002 | Cheng et al. |
| 2002/0190284 A1 | 12/2002 | Murthy et al. |
| 2003/0003679 A1 | 1/2003 | Doyle et al. |
| 2003/0013323 A1 | 1/2003 | Hammond et al. |
| 2003/0025131 A1 | 2/2003 | Lee et al. |
| 2003/0034529 A1 | 2/2003 | Fitzgerald et al. |
| 2003/0057439 A1 | 3/2003 | Fitzgerald |
| 2003/0080361 A1 | 5/2003 | Murthy et al. |
| 2003/0089901 A1 | 5/2003 | Fitzgerald |
| 2003/0102498 A1 | 6/2003 | Braithwaite et al. |
| 2003/0113971 A1 | 6/2003 | Nagaoka et al. |
| 2003/0162348 A1 | 8/2003 | Yeo et al. |
| 2003/0199126 A1 | 10/2003 | Chu et al. |
| 2003/0203600 A1 | 10/2003 | Chu et al. |
| 2003/0215990 A1 | 11/2003 | Fitzgerald et al. |
| 2003/0218189 A1 | 11/2003 | Christiansen |
| 2003/0227029 A1 | 12/2003 | Lochtefeld et al. |
| 2003/0227057 A1 | 12/2003 | Lochtefeld et al. |
| 2004/0005740 A1 | 1/2004 | Lochtefeld et al. |
| 2004/0007724 A1 | 1/2004 | Murthy et al. |
| 2004/0014276 A1 | 1/2004 | Murthy et al. |
| 2004/0014304 A1 | 1/2004 | Bhattacharyya |
| 2004/0031979 A1 | 2/2004 | Lochtefeld |
| 2004/0041210 A1 | 3/2004 | Mouli |
| 2004/0061191 A1 | 4/2004 | Paton et al. |
| 2004/0070035 A1 | 4/2004 | Murthy et al. |
| 2004/0075148 A1 | 4/2004 | Kumagi et al. |
| 2004/0075149 A1 | 4/2004 | Fitzgerald et al. |
| 2004/0084735 A1 | 5/2004 | Murthy et al. |
| 2004/0119101 A1 | 6/2004 | Schrom et al. |
| 2004/0121564 A1 | 6/2004 | Gogoi |
| 2004/0142545 A1 | 7/2004 | Ngo et al. |
| 2004/0173815 A1 | 9/2004 | Yeo et al. |
| 2004/0175893 A1 | 9/2004 | Vatus et al. |
| 2004/0217430 A1 | 11/2004 | Chu |
| 2004/0219726 A1 | 11/2004 | Fitzgerald |
| 2004/0253774 A1 | 12/2004 | Boyanov et al. |
| 2004/0253776 A1 | 12/2004 | Hoffman et al. |
| 2004/0256613 A1 | 12/2004 | Oda et al. |
| 2004/0262683 A1 | 12/2004 | Bohr et al. |
| 2005/0009263 A1 | 1/2005 | Yeo et al. |
| 2005/0042849 A1 | 2/2005 | Currie et al. |
| 2005/0077511 A1 | 4/2005 | Fitzergald |
| 2005/0112048 A1 | 5/2005 | Tsakalakos et al. |
| 2005/0130454 A1 | 6/2005 | Murthy et al. |
| 2005/0156169 A1 | 7/2005 | Chu |
| 2005/0156180 A1 | 7/2005 | Zhang et al. |
| 2005/0156210 A1 | 7/2005 | Currie et al. |
| 2005/0161711 A1 | 7/2005 | Chu |
| 2005/0167652 A1 | 8/2005 | Hoffmann et al. |
| 2005/0176204 A1 | 8/2005 | Langdo et al. |
| 2005/0250298 A1 | 11/2005 | Bauer |
| 2005/0277272 A1 | 12/2005 | Singh et al. |
| 2005/0280026 A1 | 12/2005 | Isaacson et al. |
| 2005/0280098 A1 | 12/2005 | Shin et al. |
| 2006/0008958 A1 | 1/2006 | Yeo et al. |
| 2006/0009001 A1 | 1/2006 | Huang et al. |
| 2006/0057825 A1 | 3/2006 | Bude et al. |

FOREIGN PATENT DOCUMENTS

| | | |
|---|---|---|
| EP | 0390661 | 10/1990 |
| EP | 0 514 018 | 11/1992 |
| EP | 0 587 520 | 3/1994 |
| EP | 0 683 522 A2 | 11/1995 |
| EP | 0 828 296 | 3/1998 |
| EP | 0 829 908 | 3/1998 |
| EP | 0 838 858 | 4/1998 |
| EP | 1 020 900 A2 | 7/2000 |
| EP | 1 174 928 | 1/2002 |
| FR | 2 701 599 | 9/1993 |
| GB | 2 342 777 | 4/2000 |
| JP | 61/141116 | 6/1986 |
| JP | 2/210816 | 8/1990 |
| JP | 3/036717 | 2/1991 |
| JP | 4074415 | 3/1992 |
| JP | 4-307974 | 10/1992 |
| JP | 5-166724 | 7/1993 |
| JP | 6-177046 | 6/1994 |
| JP | 6-244112 | 9/1994 |
| JP | 6-252046 | 9/1994 |
| JP | 7-094420 | 4/1995 |
| JP | 7-106446 | 4/1995 |
| JP | 7-240372 | 9/1995 |
| JP | 10-270685 | 10/1998 |
| JP | 11-233744 | 8/1999 |
| JP | 2000-021783 | 1/2000 |
| JP | 2000031491 | 1/2000 |
| JP | 201319935 | 5/2000 |
| JP | 2002-076334 | 3/2002 |
| JP | 2002-164520 | 6/2002 |
| JP | 2002-324765 | 8/2002 |
| JP | 2002-289533 | 10/2002 |
| WO | 98/59365 | 12/1998 |
| WO | 99/53539 | 10/1999 |
| WO | 00/48239 | 8/2000 |
| WO | 00/54338 | 9/2000 |
| WO | 01/22482 | 3/2001 |
| WO | 01/54202 | 7/2001 |
| WO | 01/93338 A1 | 12/2001 |
| WO | 01/99169 A2 | 12/2001 |
| WO | 02/13262 | 2/2002 |
| WO | 02/15244 | 2/2002 |
| WO | 02/27783 A1 | 4/2002 |
| WO | 02/47168 | 6/2002 |
| WO | 02/071488 | 9/2002 |
| WO | 02/071491 | 9/2002 |
| WO | 02/071495 | 9/2002 |
| WO | 02/082514 | 10/2002 |
| WO | 2004/006311 | 1/2004 |
| WO | 2004/006327 | 1/2004 |

OTHER PUBLICATIONS

G. Badenes et al., "Optimization of Parameters in a Law Cost, High Peformance Deep Submicron CMOS Technology", 1999 Proc. 29th European Solid-State Device Res. Coat 628.

John Ogawa Borland, "Novel Device Structures by Selective Epitaxial Growth (SEG)", 1987 Int'l Electron Devices Meeting Tech. Dig 12.

John D. Cressler, "SiGe HBT Technology: A New Contender for Si-Based RF and Microwave Circuit Applications", 46 IEEE Transactions on Microwave Theory and Tech. 572 (1998).

N. Endo et al., "Novel Device Isolation Technology with Selective Epitaxial Growth", 1982 Int'l Electron Devices Meeting Tech, Dig. 241 (1982).

Nobuhiro Endo et al., "Scaled CMOS Technology Using SEG Isolation and Buried Well Process", 33 IEEE Transactions on Electron Devices 1659 (1986).

Richard B. Fair, "Boron Diffusion in Silicon-Concentration and Orientation Dependence, Background Effects and Profile Estimation", 122 J. Electrochemical Soc'y 800 (1975).

J. T. Fitch, "Selectivity Mechanisms in Low Pressure Selective Epitaxial Silicon Growth", 141 J. Electrochemical Society 1046 (1994).

C.S. Fuller & J.A. Ditzenberger, "Diffusion of Donor and Acceptor Elements in Silicon", 27 J. Applied Physics 544 (1956).

R. Gwoziecki et al., "Suitabiity of Elevated Source/Drain for Deep Submicron CMOS", 1999 Proc. 29th European Solid-State Device Res. Conf. 384.

D.L. Harame et al., "A High-Performance Epitaxial SiGe-Base ECL BiMOS Technology", 1992 Int'l Electron Devices Meeting Tech. Dig. 19.

P. L Huang et al, "N-Channel MOS Transistors Below 0.5 μm. with UltraShallow Channels Formed by Low Temperature Selective Silicon Epitaxy", 387 Materials Res. Soc'y Symp. Proc. 347 (1995).

Akihiko Ishitani et at., "Local Loading Effect in Selective Silicon Epitaxy", 23 Japanese J. Applied Physics L391 (1984).

S. T. Kim & Y. J. Lee, "Properties of C-Axis Oriented Freestanding GaN Substrates Prepared on Fused Silica Glass by Hydride Vapor Phase Epitaxy", 33 J. Korean Physical Soc'y L1 (1998).

Hiroshi Kitajima et al., "Crystalline Defects in Selectively Epitaxial Silicon Layers", 22 Japanese J. Applied Physics L783 (1983).

S. K. Lee et al., "High Quality Tin Epitaxial Silicon Layers Deposited Selectively by Rapid Therrmal Processing", 1989 Proc. Second Int'l Symp' on Ultra Large Scale Integration Sci. Tech. 233.

B.S. Meyerson, "Low-Temperature Silicon Epitaxy by Ultrahigh Vacuum/Chemical Vapor Disposition, 48 Applied Physics Letters" 797 (1986).

M.R. Mirabedini et al., "Submicrometre Elevated Source and Drain MOSFET Technology Using E-Beam Evaporated Silicon", 33 Electronics Letters 1183 (1997).

Akihiro Miyauchi et al., "Low Temperature (850"C) Silicon Selective Epitaxial Growth on HF-Treated Si (100) Substrates Using Sits-HCI-$H_2$ System", 138 J. Electrochemical Soc'y 3480 (1991).

Mehrdad M. Moleshi et al., "Single-Wafer Integrated Semiconductor Device Processing", 39 IEEE Transactions on Electron Devices 4 (1992).

K.J. van Oostrum et al., "Characterization of Epitaxial Layers by the Depth Dependence of Boron Diffusivity", 61 Applied Physics Letters 1513 (1992).

Keunhymg Park et al., "Analysis of Ion-Implanted Amorphous and Polycrystalline Silicon Films as Diffusion Sources for Ultrashallow Junctions", 70 J. Applied Physics 1397 (1991).

J.R. Pfiester & P.B. Griffin, "Anomalous Co-Diffusion Effects of Germanium on Group III and V Dopants in Silicon", 52 Applied Physics Letters 471 (1988).

E.J. Prinz et al., "The Effects of Base Dopant Outdiffusion and Undoped Si1-xGex Junction Spacer Layers in Si/Si1-xGex/Si Herterojunction Bipolar Transistors", 12 IEEE Electron Device Letters 42 (1991).

E.J. Prinz et al., "The Effect of Base-Emitter Spacers and Strain Dependent Densities of States in Si/Si1-xGex/Si Heterojunction Bipolar Transistors", 1989 Int'l Electron Devices Meeting Tech. Dig. 639 (1989).

S. Song et al., "Facet Formation in Selectively Overgrown Silicon by Reduced Pressure Chemical Vapor Deposition", 1998 Dig. Papers Microprocesses and Nanotechnology '98 240.

Alan R. Stivers & Chiu H. Ting "Growth Condition Dependence of SEG Planarity and Electrical Characteristics", 1987 Proc. Tenth Int'l Conf. on Chemical Vapor Deposition 389.

J. Sun et al., "Parasitic Resistance Considerations of Using Elevated Source/Drain Technology for Deep Submicron Metal Oxide Semiconductor Field Effect Transistors", 145 J. Electrochemical Soc'y 2131 (1998).

S. Suzuki & T. Itoh, "Effects of Si-Ge Buffer Layer for Low-temperature Si Epitaxial Growth on Si Substrate by RF Plasma Chemical Vapor Deposition", 54 J. Applied Physics 1466 (1983).

Kohetsu Tanno et al., "Selective Silicon Epitaxy Using Reduced Pressure Technique", 21 Japanese J. Applied Physics L564 (1982).

K. Weldon et al, "Raised Source-Drains Using Selective Silicon Deposition for Sub-Half Micron CMOS Devices", 94-2 Extended Abstracts Fall Meeting Electrochemical Society 756 (1994).

H. Van Meer et al., "High Performance Raised Gate/Source/Drain Transistors for Sub-0.15 μm CMOS Technologies"s , 1999 Proc. 29th European Solid-State Device Res. Conf. 572 (1999).

A. Waite et at., "A Novel Deep Submicron Elevated Some/Drain MOSFET", 1998 Proc. 2e European Solid-State Device Res. Conf. 885 (1998).

Satoshi Yamakawa et al. "Drivability Improvement on Deep Submicron MOSFET's by Elevation of Source/Drain Regions", 20 IEEE Electron Device Letters 366 (1999).

Aldrich et al., "Stability of C54 Titanium Germanosilicide on a Silicon-Germanium Alloy Substrate," *Journal of Applied Physics*, vol. 77, No. 10 (1995) 5107-5114.

Antoniadis et al., "SOI Devices and Technology," *SOI devices and technology*, Neuilly sur Seine, France, (1999), pp. 81-87.

Aoyama et al., "Facet formation mechanism of silicon selective epitaxial layer by Si ultrahigh vacuum chemical vapor deposition," *Journal of Crystal Growth*, 136 (1994), pp. 349-354.

Armstrong "Technology for SiGe Heterostructure-Based CMOS Devices," Ph.D. Thesis, Massachusetts Institute of Technology, Department of Electrical Engineering and Computer Science (Jun. 30, 1999).

Armstrong et al., "Design of Si/SiGe Heterojunction Complementary Metal-Oxide-Semiconductor Transistors," IEDM Technical Digest (1995 International Electron Devices Meeting), pp. 761-764.

Augusto et al., "Proposal for a New Process Flow for the Fabrication of Silicon-based Complementary MOD-MOSFETs without ion Implantation," *This Solid Films*, vol. 294, No. 1-2, pp. 254-257 (Feb. 15, 1997).

Arst et al., "Surface planarity and microstructure of low temperature silicon SEG and ELO," *Journal of Materials Research*, vol. 6, No. 4 (Apr. 1991), pp. 784-791.

Aubry-Fortuna et al., "Phase Formation and Strain Relaxation During Thermal Reaction of Zr and Ti with Strained Si1-x-y GexCy Epilayers," *Journal of Applied Physics*, vol. 88, Iss. 3 (2000), 1481-1423.

Augendre, "Elevated Source/Drain by Sacrificial Selective Epitaxy for High Performance Deep Submicron CMOS: Process Window versus Complexity," *IEEE Transactions on Electron Devices*, vol. 47, No. 7 (Jul. 2000), pp. 1484-1491.

Barradas et al., "RBS analysis of MBE-grown SiGe/(001) Si heterostructures with thin, high Ge content SiGe channels for HMOS transistors," Modern Physics Letters B, 2001 (abstract).

Borenstein et al., "A New Ultra-Hard Etch-Stop Layer for High Precision Micromachining," Proceedings of the 1999 12th IEEE International Conference on Micro Electro Mechanical Systems (MEMs) (Jan. 17-21, 1999), pp. 205-210.

Bouillon et al., "Search for the optimal channel architecture for 9.18/0.12 um bulk CMOS experimental study," IEEE, (1996), pp. 21.2.1-21.2.4.

Bruel et al., "® Smart Cut: A Promising New SOI Material Technology." Proceedings of the 1995 IEEE International SOI Conference (Oct. 1995), pp. 178-179.

Bruel, "Silicon on Insulator Material Technology," *Electronic Letters*, vol. 31, No. 14 (Jul. 6, 1995), pp. 1201-1202.

Bufler et al., "Hole transport in strained $Si_{1-x}Ge_x$ alloys on $Si_{1-y}Ge_y$ substrates," *Journal of Applied Physics*, vol. 84, No. 10 (Nov. 15, 1998), pp. 5597-5602.

Burghartz et al., "Microwave Inductors and Capacitors in Standard Multilevel Interconnect Silicon Technology," *IEEE Transactions on Microwave Theory and Techniques*, vol. 44, No. 1 (Jan. 1996), pp. 100-104.

Cao et al., "0.18-mm Fully-Depleted Silicon-on-Insulator MOSFET's," *IEEE Electron Device Letters*, vol. 18, No. 6 (Jun. 1997), pp. 251-253.

Canaperi et al., "Preparation of a relaxed Si-Ge layer on an insulator in fabricating high-speed semiconductor devices with strained epitaxial films," Intern. Business Machines Corporation, USA, 2002 (abstract).

Carlin et al., "High Efficiency GaAs-on Si Solar Cells with High Voc Using Graded GeSi Buffers," IEEE (2000), pp. 1006-1011.
Chang et al., "Selective Etching of SeGe/Si Heterostructures," *Journal of the Electrochemical Society*, No. 1 (Jan. 1991), pp. 202-204.
Cheng et al., "Electron Mobility Enhancement in Strained-Si n-MOSFETs Fabricated on SiGe-on-Insulator (SGOI) Substrates," *IEEE Electron Device Letters*. vol. 22, No. 7 (Jul. 2001), pp. 321-323.
Cheng et al., "Relaxed Silicon-Germanium on Insulator Substrate by Layer Transfer," *Journal of Electronic Materials*, vol. 30, No. 12 (2001), pp. L37-L39.
Cullis et al., "Growth ripples upon strained SiGe expitaxial layers on Si and misfit dislocation interactions," *Journal of Vacuum Science and Technology A*. vol. 12, No. 4 (Jul/Aug. 1994), pp. 1924-1931.
Chieh et al., "Low-Resistance Bandgap-Engineered W/Si1-xGex/Si Contacts," *IEEE Electron Device Letters*, vol. 17, No. 7 (Jul. 1996) pp. 360-362.
Choi et al., "30nm ultra-thin body SOI MOSFET with selectively deposited Ge raised S/D," 58th *Device Research Conference* (2000) pp. 23-24.
Choi et al., "Nanoscale Ultrathin Body PMOSFETs With Raised Selective Germanium Source/Drain," *IEEE Electron Device Letters*, vol. 22, No. 9 (Sep. 2001), pp. 447-448.
Currie et al., "Carrier mobilities and process stability of strained Si n- and p-MOSFETs on SiGe virtual substrates," *Journal of Vacuum Science and Technology B*. vol. 19, No. 6 (Nov./Dec. 2001), pp. 2268-2279.
Currie et al., "Controlling Threading Dislocation in Ge on Si Using Graded SiGe Layers and Chemical-Mechanical Polishing," *Applied Physics Letters*, vol. 72, No. 14 (Feb. 1998), pp. 1718-1720.
Detavernier et al., "$CoSi_2$ Nucleation in the Presence of Ge," *Thin Solid Films*, vol. 384, No. 2 (2001), pp. 243-250.
Drowley et al., "Model for facet and sidewall defect formation during selective epitaxial growth of (001) silicon," *Applied Physics Letters*, 52 (7) (Feb. 15, 1988), pp. 546-548.
Eaglesham et al., "Growth Morphology and the Equilibrium Shape: The Role of "Surfactants" in the Ge/Si Island Formation," *Physical Review Letters*, vol. 70, No. 7 (Feb. 15, 1993), pp. 966-969.
Eberhart et al., "Ni/Ag Metallization for SiGe HBTs using a Ni Silicide Contact," *Semiconductor Science and Technology* vol. 16, No. 9, (2001) pp. L47-L49.
Eaglesham et al., "Dislocation-Free Stranski-Krastanow Growth of Ge on Si(100)," *Physical Review Letters*, vol. 64, No. 16 (Apr. 16, 1990), pp. 1943-1946.
Feijoo et al., "Epitaxial Si-Ge Etch Stop Layers with Ethylene Diamine Pyrocatechol for Bonded and Etchback Silicon-on-Insulator," *Journal of Electronic Materials*, vol. 23, No. 6 (Jun. 1994), pp. 493-496.
Fischetti et al., "Band structure, deformation potentials, and carrier mobility in strained Si, Ge, and SiGe alloys," *Journal of Applied Physics*, vol. 80, No. 4 (Aug. 15, 1996), pp. 2234-2252.
Fischetti, "Long-range Coulomb interactions in small Si devices. Part II. Effective electronmobility in this-oxide structures," *Journal of Applied Physics*, vol. 89, No. 2 (Jan. 15, 2001), pp. 1232-1250.
Fitzgerald et al., "Dislocation dynamics in relaxed graded composition semiconductors," *Materials Science and Engineering*, B67 (1999), pp. 53-61.
Fitzgerald et al., "Relaxed $Ge_xSi_{1-x}$ structures for III-V integration with Si and high mobility two-dimensional electron gases in Si," *Journal of Vacuum Science and Technology*, (Jul./Aug. 1992), pp. 1807-1819.
Fitzgerald et al., "Totally Relaxed $Ge_xSi_{1-x}$ Layers with Low Threading Dislocation Densities Grown on Si Substrates," *Applied Physics Letters*, vol. 59, No. 7 (Aug. 12, 1991), pp. 811-813.
Freiman et al., "Kinetics of Processes in the $Ti-Si_{1-x} Ge_x$ Systems," *Applied Physics Letters* vol. 69, No. 25 (1996) pp. 3821-3823.
Freiman et al., "Titanium Metallization of Si/Ge Alloys and Superlattices," *Thin Solid Films* vol. 294, No. 1-2 (1997) pp. 217-219.
Gallas et al., "Influence of doping on facet formation at the SiO2/Si interface," *Surface Science*, 440 (1999), pp. 41-48.
Gannavaram, et al., "Low Temperature ($\leq 800°$ C.) Recessed Junction Selective Silicon-Germanium Source/Drain Technology for sub-70 nm CMOS," *IEEE International Electron Device Meeting Technical Digest*, (2000), pp. 437-440.

Ge et al., "Process-Strained Si (PSS) CMOS Technology Featuring 3D Strain Engineering," *IEEE International Electron Devices Meeting Technical Digest*, (2003) pp. 73-76.
Ghani et al., "A 90nm High Volume Manufacturing Logic Technology Featuring Novel 45nm Gate Length Strained Silicon CMOS Transistors," *IEEE International Electron Devices Meeting Technical Digest*, (2003), 11.6.1-11.6.3.
Glück et al., "$CoSi_2$ and $TiSi_2$ for Si/SiGe heterodevices," *Thin Solid Films*, vol. 270 (1995) pp. 549-554.
Goulding, "The selective epitaxial growth of silicon," *Materials Science and Engineering*, B17 (1993), pp. 47-67.
Greve et al., "Growth Rate of Doped and Undoped Silicon by Ultra-High Vacuum Chemical Vapor Deposition," *Journal of the Electrochemical Society*, vol. 138, No. 6 (Jun. 1991), pp. 1744-1748.
Garone et al., "Silicon vapor phase epitaxial growth catalysis by the presence of germane," *Applied Physics Letters*, vol. 56, No. 13 (Mar. 26, 1990), pp. 1275-1277.
Godbey et al., (1990) "Fabrication of Bond and Etch-Back Silicon Insulator Using a Strained $Si_{0.7}Ge_{0.3}$ Layer as an Etch Stop," *Journal of the Electrical Society*, vol. 137, No. 10 (Oct. 11990) pp. 3219-3223.
Gray et al., "Analysis and Design of Analog Integrated Circuits," John Wiley & Sons, 1984, pp. 605-632.
Grillot et al., "Acceptor diffusion and segregation in $(Al_xGa_{1-x})_{0.5}In_{0.5}P$ heterostructures," *Journal of Applied Physics*, vol. 91, No. 8 (2002), pp. 4891-4899.
Grüzmacher et al., "Ge segregation in SiGe/Si heterostructures and its dependence on deposition technique and growth atmosphere," *Applied Physics Letters*, vol. 63, No. 18 (Nov. 1, 1993), pp. 2531-2533.
Hackbarth et al, "Alternatives to Thick MBE-Grown Relaxed SiGe Buffers," *This Solid Films*, vol. 369, pp. 148-151 (2000).
Hackbarth et al., "Strain relieved SiGe buffers for Si-based heterostructure field-effect transistors," *Journal of Crystal Growth*, vol. 201/202 (1999), pp. 734-738.
Halsall et al., "Electron diffraction and Raman studies of the effect of substrate misorientation on ordering in the AlGaInP system," *Journal of Applied Physics*, vol. 85, No. 1 (1999), pp. 199-202.
Hamada et al., "A New Aspect of Mechanical Stress Effects in Scaled MOS Devices," *IEEE Transactions on Electron Devices*, vol. 38, No. 4 (Apr. 1991), pp. 895-900.
Hsiao et al., "Advanced Technologies for Optimized Sub-Quarter-Micrometer SOI CMOS Devices," *IEEE Transactions on Electron Devices*, vol. 45, No. 5 (1998) pp. 1092-1098.
Huang et al., "Electrical and Compositional Properties of Co-Silicided Shallow P+-n Junction Using Si-Capped/Boron-Doped $Si1-xGex$ Layer Deposited by UHVCME," *Journal of the Electrochemical Society*, vol. 148, No. 3 (2001) pp. G126-C131.
Huang et al., "Isolation Process Dependence of Channel Mobility in Thin-Film SOI Devices," *IEEE Electron Device Letters*, vol. 17, No. 6 (Jun. 1996), pp. 291-293.
Huang et al., "LOCOS-Induced Stress Effects on Thin-Film SOI Devices," *IEEE Transactions on Electron Devices*, vol. 44, No. 4 (Apr. 1997), pp. 646-650.
Huang, et al., "Reduction of Source/Drain Series Resistance and Its Impact on Device Performance for PMOS Transistors with Raised $Si1-xGex$ Source/Drain", *IEEE Electron Device Letters*, vol. 21, No. 9, (Sep. 2000) pp. 448-450.
Huang, et al., "Study on Ge/Si Ration Silidation, and Strain Relaxation of High Temperature Sputtered $Co/Si1-x Gex$ Structures," *Journal of Applied Physics*, vol. 88, No. 4 (2000) pp. 1831-1837.
Herzog et al., "SiGe-based FETs: Buffer Issues and Device Results," *Thin Solid Films*, vol. 380, No. 1-2, pp. 36-41 Dec. 12, 2000.
Höck et al., "Carrier mobilities in modulation doped $Si_{1-x}Ge_x$ heterostructures with respect to FET applications," *Thin Solid Films*, vol. 336 (1998), pp. 141-144.
Höck et al., "High hole mobility in $Si_{0.17}Ge_{0.33}$ channel metal-oxide-semiconductor field-effect transistors grown by plasma-enhanced chemical vapor deposition," *Applied Physics Letters*, vol. 76, No. 26 (Jun. 26, 2000), pp. 3920-3922.
Höck et al., "High performance 0.25 um *p*-type Ge/SiGe MODFETs," *Electronics Letters*, vol. 34, No. 19 (Sep. 17, 1998), pp. 1888-1889.

Hsu et al., "Surface morphology of related $Ge_xSi_{1-x}$ films," *Appl. Phys. Lett.*, vol. 61, No. 11 (1992), pp. 1293-1295.

Huang et al., (2001) "Carrier Mobility enhancement in strained Si-on insulatoir fabricated by wafer bonding", *2001 Symposium on VLSI Technology, Digest of Technical Papers*, pp. 57-58.

Huang et al., "High quality strain-relaxed SiGe alloy grown on implanted silicon on-insulator substrate," *Applied Physics Letters*, vol. 76, No. 19 (May 8, 2000), pp. 2680-2682.

Huang et al., "The Impact of Scaling Down to Deep Submicron on CMOS RF Circuits," *IEEE Journal of Solid-State Circuits*, vol. 33, No. 7 (Jul. 1998), pp. 1023-1036.

IBM Technical Disclosure Bulletin, "Optimal Growth Technique and Structure for Strain Relaxation of Si-Ge Layers on Si Substrates," vol. 32, No. 8A (Jan. 1990), pp. 330-331.

IBM Technical Disclosure Bulletin, "2 Bit/Cell EEPROM Cell Using Band to Band Tunneling for Data Read-Out," vol. 35, No. 4B (Sep. 1992), pp. 136-140.

Ishikawa et al., "Creation of Si-Ge-based SIMOX structures by low energy oxygen implantation," Proceedings for the 1997 IEEE International SOI Conference (Oct. 1997), pp. 17-18.

Ishikawa et al., "SiGe-on-insulator substrate using SiGe alloy grown Si(001)," *Applied Physics Letters*, vol. 75, No. 7 (Aug. 16, 1999), pp. 983-985.

Ismail et al., "Modulation-doped n-type Si/SiGe with Inverted Interface," *Applied Physics Letters*, 65 (10), pp. 1248-1250 Sep. 5, 1994.

Ismail, "Si/SiGe High-Speed Field-Effect Transistors," International Electron Devices Meeting, Washington, D.C. (Dec. 10, 1995), pp. 20.1.1-20.1.4.

Iida et al., "Thermal behavior of residual strain in silicon-on-insulator bonded wafer and effects on electron mobility," *Solid-State Electronics*, vol. 43 (1999), pp. 1117-1120.

Ilderem et al., "Very low pressure chemical vapor deposition process for selective titanium silicide films," *Appl. Phys. Lett.*, vol. 53, No. 8 (Aug. 22, 1988) pp. 687-689.

Ishitani et al., "Facet Formation in Selective Silicon Epitaxial Growth," *Japanese Journal of Applied Physics*, vol. 24, No. 10 (Oct. 1985), pp. 1267-1269.

Ito et al., "Mechanical Stress Effect on Etch-Stop Nitride and its Impact on Deep Submicron Transistor Design," *IEEE International Electron Devices Meeting Technical Digest*, (2000), pp. 247-250.

Jang et al., "Phosphorus doping of epitaxial Si and Si1-xGex at very low pressure," *Applied Physics Letters*, 63 (12) (Sep. 20, 1993), pp. 1675-1677.

Jastrzebski, "SOI by CVD: Epitaxial Lateral Overgrowth (ELO) Process—Review," *Journal of Crystal Growth*, 63 (1983), pp. 493-526.

Jungemann et al., "Full-Band Monte Carlo Simulation of a 0.12 μm-Si-PMOSFET with and without a Strained SiGe-Channel", *IEEE Electron Devices Meeting*, 1998, pp. 897-900.

Kamins et al., "Kinetics of selective epitaxial deposition of Si1-xGex," *Applied Physics Letters*, 61 (6) (Aug. 10, 1992), pp. 669-671.

Kandel et al., "Surfactant Mediated Crystal Growth of Semiconductors," *Physical Review Letters*, vol. 75, No. 14 (Oct. 2, 1995), pp. 2742-2745.

King et al., "A Polycrystalline $Si_{1-x}Ge_x$-Gate CMOS Technology", *IEEE*, Volume, No. 1990, pp. 253-256.

King, "Silicon-Germanium: from Microelectronics to Micromechanics," Presentation to the Thin Film Users Group Meeting, AVS Northern California Chapter, Apr. 17, 2002.

Kitajima et al., "Lattice Defect in Selective Epitaxial Silicon and Laterally Overgrown Regions on SiO2," *Journal of Crystal Growth*, 98 (1989), pp. 264-276.

Ku et al., "High Performance PMOSFETS With $Ni(Si_{1-x} Ge_x)$/Poly-$S_{i0}$-$8Ge_{0.2}$ Gate," *IEEE- 2000 Symposium on BLSI Technology Digest of Technical Papers*, pp. 114-115 (2000).

Kummer et al., "Low energy plasma enhanced chemical vapor deposition," *Materials Science and Engineering*, B89 (2002), pp. 288-295.

Kurosawa et al., "A New Bird's Beak Free Field Isolation Technology for VLSI Devices," *IEDM Technical Digest*, Washington, D.C., Dec. 7-9, 1981, pp. 384-387.

Kearney et al., "The effect of alloy scattering on the mobility of holes in a $Si_{1-x}Ge_x$ quantum well," *Semiconductor Science and Technology*, vol. 13 (1998).

Kim et al., "A Fully Integrated 1.9-GHz CMOS Low-Noise Amplifier," *IEEE Microwave and Guided Wave Letters*, vol. 8, No. 8 (Aug. 1998), pp. 293-295.

Koester et al., "Extremely High Transconductance $Ge/Si_{0.4}Ge_{0.6}$ p-MODFET's Grown by UHV-CVD," *IEEE Electron Device Letters*, vol. 21, No. 3 (Mar. 2000), pp. 110-112.

Konig et al., "Design Rules for N-Type SiGe Hetero FETs," *Solid State Electronics*, vol. 41, No. 10, pp. 1541-1547 Oct. 1, 1997.

König et al., "p- Type Ge-Channel MODFET's with High Transconductance Grown on Si Substrates," *IEEE Electron Device Letters*, vol. 14, No. 4 (Apr. 1993), pp. 205-207.

König et al., "SiGe HBTs and HFETs," *Solid-State Electronics*, vol. 38, No. 9 (1995), pp. 1959-1602.

Kuznetsov et al., "Technology for high-performance n-channel SiGe modulation-doped field-effect transistors," *J. Vac. Sci. Technol.*, B 13(6), pp. 2892-2896 (Nov./Dec. 1995).

Langdo et al., (2002) "Preparation of Novel SiGe-free Strained Si on Insulator Substrates" *IEEE International SOI Conference*, pp. 211-212 (XP002263057).

Larson, "Integrated Circuit Technology Options for RFIC's—Present Status and Future Directions," *IEEE Journal of Solid-State Circuits*, vol. 33, No. 3 (Mar. 1998), pp. 387-399.

Lee et al., "CMOS RF Integrated Circuits at 5 GHz and Beyond," *Proceedings of the IEEE*, vol. 88, No. 19 (Oct. 2000), pp. 1560-1571.

Lee et al., "Strained Ge channel p-type metal-oxide-semiconductor field-effect transistors grown on $Si_{1-x}Ge_x$/Si virtual substrates," *Applied Physics Letters*, vol. 79, No. 20 (Nov. 12, 2001), pp. 3334-3346.

Lee et al., "Strained Ge channel p-type MOSFETs fabricated on $Si_{1-x}Ge_x$/Si virtual substrates," *Material Research Society Symposium Proceedings*, vol. 686 (2002), pp. A1.9.1-A1.9.5.

Leitz et al., "Channel Engineering of SiGe-Based Heterostructures for High Mobility MOSFETs," *Material Research Society Symposium Proceedings*, vol. 686 (2002), pp. A3.10.1-A3.10.6.

Leitz et al., "Dislocation glide and blocking kinetics in compositionally graded SiGe/Si," *Journal of Applied Physics*, vol. 90, No. 6.

Leitz et al, "Hole mobility enhancements in strained $Si/Si_{1-y}Ge_y$ p-type metal-oxide-semiconductor field-effect transistors grown on relaxed $Si_{1-x}Ge_x$ (X<y) virtual substrates," *Applied Physics Letters*, vol. 79, No. 25 (Dec. 17, 2001), pp. 4246-4248.

Li et al., "Design of high speed Si/SiGe heterojunction complementary metal-oxide-semiconductor field-effect transistors with reduced short-channel effects," *Vacuum Science and Technology A*, vol. 20, No. 3 (May/Jun. 2002), pp. 1930-1033.

Lu et al., "High Performance 0.1 μm Gate-Length P-Type SiGe MODFET's and MOS-MODFET's," *IEEE Transactions on Electron Devices*, vol. 47, No. 8 (Aug. 2000), pp. 1645-1652.

Lai, J.B. et al., "Effects of Composition on the Formation Temperatures and Electrical Resistivities of C54 Titanium Germanosilicide in Ti- $Si_{1-x}$ $Ge_x$ Systems," *Journal of Applied Physics*, vol. 86, No. 3 (1999) pp. 1340-1345.

Langdo, "Selective SiGe Nanostructures," Ph.D. Thesis, Massachusetts Institute of Technology, 2001.

Li et al., "Modeling of facet growth on patterned Si substrate in gas source MBE," *Journal of Crystal Growth*, 157 (1995), pp. 185-189.

Lochtefeld et al., "Investigating the Relationship Between Electron Mobility and Velocity in Deeply Scaled NMOS via Mechanical Stress," *IEEE Electron Device Letters*, vol. 22, No. 12 (2001), pp. 591-593.

Lochtefeld, "Toward the End of the MOSFET Roadmap: Investigating Fundamental Transport Limits and Device Architecture Alternatives," Ph.D. Thesis, Massachusetts Institute of Technology, 2001.

Lynch, "Self-Aligned Contact Schemes for Source-Drains in Submicron Devices," *IEDM Technical Digest* (1987) pp. 354-357.

Maillard-Schaller et al., "Role of the substrate strain in the sheet resistance stability of NiSi deposited on Si(100)," *Journal of Applied Physics*, vol. 85, No. 7 (Apr. 1, 1999) pp. 3614-3618.

Maiti et al., "Strained-Si Heterostructure Field Effect Transistors," *Semicond. Sci. Technol.*, vol. 13, pp. 1225-1246.

Mercier et al., "Selective TiSi₂ Deposition with no Silicon Substrate Consumption by Rapid Thermal Processing in a LPCVD Reactor," *Journal of Electronic Materials*, vol. 19, No. 3 (1990) pp. 253-258.
Meyer, "Elevated Source/Drain Structures," *The ASM Epitaxy Newsletter of Continuous Improvement*, (Spring 1998) pp. 1-3.
Meyerson et al., "Phosphorus-Doped Polycrystalline Silicon via LPCVD," *Journal of the Electrochemical Society*, vol. 131, No. 10 (Oct. 1984), pp. 2366-2368.
Miyano et al., "Facet-Free Si Selective Epitaxial Growth Adaptable to Elevated Source/Drain MOSFETs with Narrow Shallow Trench Isolation," *Japanese Journal of Applied Physics*, vol. 38, Part 1, No. 4B (Apr. 1999), pp. 2419-2423.
Moon et al., "Application of interferometric broadband imaging alignment on an experimental x-ray stepper," *Journal of Vacuum Science and Technology*, B 16(6) (Nov./Dec. 1998), pp. 3631-3636.
Maszara, "Silicon-On-Insulator by Wafer Bonding: A Review," *Journal of the Electrochemical Society*, No. 1 (Jan. 1991), pp. 341-347.
Meyerson et al., "Cooperative Growth Phenomena in Silicon/Germanium Low-Temperature Epitaxy," *Applied Physics Letters*, vol. 53, No. 25 (Dec. 19, 1998), pp. 2555-2557.
Mizuno et al., "Advanced SOI-MOSFETs with Strained-Si Channel for High Speed CMOS-Electron/Hole Mobility Enhancement," Digest of Technical Papers, 2002 Symposium on VLSI Technology, Honolulu, Jun. 13-15, New York, NY, pp. 210-211.
Mizuno et al., "Electron and Hole Mobility Enhancement in Strained-Si MOSFET's on SiGe-on-Insulator Substrates Fabricated by SIMOX Technology," *IEEE Electron Device Letters*, vol. 21, No. 5 (May 2000), pp. 230-232.
Mizuno et al., "High Performance Strained-Si p-MOSFETs on SiGe-on-Insulator Substrates Fabricated by SIMOX Technology," *IEEE IDEM Technical Digest*, (1999 International Electron Device Meeting), pp. 934-936.
Nayak et al., "High-Mobility Strained-Si PMOSFET's," *IEEE Transactions on Electron Devices*, vol. 43, No. 10 (Oct. 1996), pp. 1709-1716.
O'Neill et al., "Si-Ge Virtual Substrate N-channel Heterojunction MOSFETs", *Semiconductor Science Technology*, vol. 14, No. 9, 1999, pp. 784-789.
Okada et al., "Epitaxial Growth of Heavily B-Doped SiGe Films and Interfacial Reaction of Ti/B-Doped SiGe Bilayer Structure using Rapid Thermal Processing," *Thin Solid Films*, vol. 369, No. 1-2 (2000) pp. 130-133.
Ootsuka et al.,"A Highly Dense, High-Performance 130nm node CMOS Technology for Large Scale System-on-a-Chip Applications," *IEEE International Electron Devices Meeting Technical Digest*, (2000), pp. 575-578.
Osburn et al., "Low parasitic resistance contacts for scaled ULSI devices," *Thin Solid Films*, 332 (1998), pp. 428-436.
Ota et al., "Novel Locally Strained Channel Technique for High Performance 55nm CMOS," *IEEE International Electron Devices Meeting Technical Digest*, (2002), pp. 27-30.
Öztürk et al., "Rapid Thermal Chemical Vapor Deposition of Germanium and Germanium/Silicon Alloys on Silicon: New Applications in the Fabrication of MOS Transistors," *Mat. Res. Soc. Symp. Proc.*, vol. 224 (1991) pp. 223-234.
Öztürk, et al., "Advanced $Si_{1-x}Ge_x$ Source/Drain and Contact Technologies for Sub-70 nm CMOS," *IEEE International Electron Device Meeting Technical Digest*, (2002), pp. 375-378.
Öztürk, et al., "Low Resistivity Nickel Germanosilicide Contacts to Ultra-Shallow $Si_{1-x}Ge_x$ Source/Drain Junctions for Nanoscale CMOS," *IEEE International Electron Device Meeting Technical Digest* (2003), pp. 497-500.
Öztürk, et al., "Selective Silicon-Gremanium Source/Drain Technology for Nanoscale CMOS," *Mat. Res. Soc. Symp. Proc.*, vol. 717, (2002), pp. C4.1.1-C4.1.12.
Öztürk, et al., "Ultra-Shallow Source/Drain Junctions for Nanoscale CMOS Using Selective Silicon-Germanium Technology," *Extended Abstracts of International Workshop on Junction Technology*, (2001), pp. 77-82.
Ota et al., "Application of heterojunction FET to power amplifier for cellular telephone," *Electronic Letters*, vol. 30, No. 11 (May 26, 1994), pp. 906-907.

Papananos, "Radio-Frequency Microelectronic Circuits for Telecommunication Applications," (1999), pp. 115-117, 188-193.
Parker et al., "SiGe Heterostructure CMOS Circuits and Applications", Solid-State Electronics, vol. 43, pp. 1497-1506 (1996).
Pfiester et al:, "A Self-Aligned Elevated Source/Drain MOSFET," *IEEE Electron Device Letters*, vol. 11, No. 9 (Sep. 1990), pp. 365-367.
Ponomarev et al., "High-Performance Deep SubMicron CMOS Technologies with Polycrystalline-SiGe Gates," *IEEE Transactions on Electron Devices*, vol. 47, No. 4, Apr. 2000, pp. 848-855.
Qin, et al., Structure and Thermal Stability of $Ni/Si_{1-x}Ge_x$ Contacts for VLSI Applications vol. 36, No. 21 (Oct. 2000) pp. 1819-1821.
Raaijmakers et al., "Enabling technologies for forming and contacting shallow junctions in Si: HF-vapor cleaning and selective epitaxial growth of Si and SiGe," *Journal of Vacuum Science and Technology*, B 17(5) (Sep./Oct. 1999), pp. 2311-2320.
Ren et al., "A Novel Implantation Free Raised Source/Drain MOSFET Process Using Selective Rapid Thermal Chemical Vapor Deposition of In-Situ Boron Doped $Si_xGe_{1-x}$," *Mat. Res. Soc. Symp. Proc.*, vol. 303 (1993) pp. 37-41.
Reynolds et al., "Selective titanium disilicide by low-pressure chemical vapor deposition," *J. Appl. Phys.*, vol. 65, No. 8 (Apr. 15, 1989) pp. 3212-3218.
Robbins et al., "A model for heterogeneous growth of Si1-xGex films from hydrides," *Journal of Applied Physics*, 69 (6) (Mar. 15, 1991), pp. 3729-3732.
Rodder et al., "Raised Source/Drain MOSFET with Dual Sidewall Spacers," *IEEE Electron Device Letters*, vol. 12, No. 3 (Mar. 1991), pp. 89-91.
Ransom et al., "Gate-Self-Aligned n-channel and p-channel Germanium MOSFET's," IEEE Transactions on Electron Devices, vol. 38, No. 12 (Dec. 1991), p. 2695.
Reinking et al., "Fabrication of high-mobility Ge p-channel MOSFETs on Si substrates," Electronics Letters, vol. 35, No. 6 (Mar. 18, 1999), pp. 503-504.
Rim, "Application of Silicon-Based Heterostructures to Enhanced Mobility Metal-Oxide-Semiconductor Field-Effect Transistors," Ph.D. Thesis, Stanford University, 1999, pp. 1-184.
Rim et al., "Enhanced Hole Mobilities in Surface-channel Strained-Si p-MOSFETs," IEEE, (1995), pp. 517-520.
Rim and Hoyt, "Fabrication and Analysis of Deep Submicron Strained-Si N-MOSFET's", IEEE Transactions on Electron Devices, vol. 47, No. 7, Jul. 2000, pp. 1406-1415.
Sadek et al., "Design of Si/SiGe Heterojunction Complementary Metal-Oxide-Semiconductor Transistors," IEEE Trans. Electron Devices, Aug. 1996, pp. 1224-1232.
Sakaguchi et al., "ELTRAN by splitting porous Si layers," Proceedings of the 195th Int. SOI Symposium, Electrochemical Society, vol. 99-3 (1999), pp. 117-121.
Schäffler, "High-Mobility Si and Ge Structures," Semiconductor Science and Technology, vol. 12 (1997), pp. 1515-1549.
Sugimoto et al., "A 2V, 500 MHz and 3V, 920 MHz Low-Power Current-Mode 0.6 μm CMOS VCO Circuit," Institute of Electronics, Information and Communication Engineers, vol. E82-C, No. 7 (Jul. 1999), pp. 1327-1329.
Samavedam et al., "Elevated source drain devices using silicon selective epitaxial growth," *Journal of Vacuum Science and Technology*, B 18(3) (May/Jun. 2000), pp. 1244-1250.
Savina et al., "Faceting of a growing crystal surface by surface diffusion," *Physical Review*, E 67, 021606 (2003), pp. 1-16.
Sedgwick et al., "Growth of Facet-Free Selective Silicon Epitaxy at Low Temperature and Atmospheric Pressure," *Journal of the Electrochemical Society*, vol. 138, No. 10 (Oct. 1991), pp. 3042-3047.
Shibata et al., "High Performance Half-Micron PMOSFETs with 0.1UM Shallow P⁺N Junction Utilizing Selective Silicon Growth and Rapid Thermal Annealing," *IEDM Technical Digest* (1987) pp. 590-593.
Shimizu et al., "Local Mechanical-Stress Control (LMC): A New Technique for CMOS-Performance Enhancement," *IEEE International Electron Devices Meeting Technical Digest*, (2001), pp. 433-436.

Sidek et al., "Reduction of parasitic bipolar transistor action and punchthrough susceptibility in MOSFETs using Si/Si1-xGex sources and drains," *Electronics Letters*, vol. 32, No. 3 (Feb. 1, 1996), pp. 269-270.

Sun et al., "A Comparative Study of n+/p Junction Formation for Deep Submicron Elevated Source/Drain Metal Oxide Semiconductor Field Effect Transistors," *Journal of the Electrochemical Society*, vol. 144, No. 10 (Oct. 1997), pp. 3659-3664.

Sun et al., "The Effect of the Elevated Source/Drain Doping Profile on Performance and Reliability of Deep Submicron MOSFET's," *IEEE Transactions on Electron Devices*, vol. 44, No. 9 (Sep. 1997), pp. 1491-1498.

Sun et al., "Impact of Epi Facets on Deep Submicron Elevated Source/Drain MOSFET Characteristics," *IEEE Transactions on Electron Devices*, vol. 45, No. 6 (Jun. 1998), pp. 1377-1380.

Thompson et al., "A 90 nm Logic Technology Featuring 50nm Strained-Silicon Channel Transistors, 7 layers of Cu Interconnects, Low k ILD, and 1 um2 SRAM Cell," *IEEE International Electron Devices Meeting Technical Digest*, (2002), pp. 61-64.

Thompson et al., "A Logic Nanotechnology Featuring Strained-Silicon," *IEEE Electron Device Letters*, vol. 25, No. 4 (Apr. 2004), pp. 191-193.

Tiwari et al., "Hole Mobility Improvement in Silicon-on-Insulator and Bulk Silicon Transistors Using Local Strain," *IEEE International Electron Devices Meeting Technical Digest*, (1997), pp. 939-941.

Tromp et al., "Local Dimer Exchange in Surfactant-Mediated Epitaxial Growth," *Physical Review Letters*, vol. 68, No. 7 (Feb. 17, 1992), pp. 954-957.

Ternent et al., "Metal Gate Strained Silicon MOSFETs for Microwave Integrated Circuits," IEEE (Oct. 2000), pp. 38-43.

Tsang et al., "Measurements of alloy composition and strain in thin GexSi1-x layers," Journal of Applied Physics, vol. 75, No. 12 (Jun. 15, 1994), pp. 8098-8108.

Tweet et al., "Factors determining the composition of strained GeSi layers grown with disilane and germane," Applied Physics Letters, vol. 65, No. 20 (Nov. 14, 1994), pp. 2579-2581.

Usami et al., "Spectroscopic study of Si-based quantum wells with neighboring confinement structure," Semicon. Sci. Technol., 1997 (abstract).

Uchino et al., "MOSFETs with Ultrashallow Junction and Minimum Drain Area Formed by Using Solid-Phase Diffusion from SiGe," *IEEE Transactions on Electron Devices*, vol. 48, No. 7 (Jul. 2001) pp. 1406-1411.

Uchino, et al., "A Raised Source/Drain Technology Using In-situ P-doped SiGe and B-doped Si for 0.1-μm CMOS ULSIs," *IEEE International Electron Device Meeting Technical Digest*, (1997), pp. 479-482.

Uhrberg et al., "Electronic and atomic structure of arsenic terminated Si(100)," *Journal of Vacuum Science and Technology*, A 4 (3) (May/Jun. 1986), pp. 1259-1264.

Violette et al., "Facet-Free Selective Silicon Epitaxy by Reduced-Pressure Chemical Vapor Deposition: Process Evaluation and Impact on Shallow Trench Isolation," *Journal of the Electrochemical Society*, 146 (5) (1999), pp. 1895-1902.

Wong et al., "Elevated Source/Drain MOSFET," *IEDM Technical Digest*, 28 (1984), pp. 634-637.

Xiang et al., "Interfacet mass transport and facet evolution in selective epitaxial growth of Si by gas source molecular beam epitaxy," *Journal of Vacuum Science and Technology*, B 14(3) (May/Jun. 1996), pp. 2381-2386.

Welser et al., "Electron Mobility Enhancement in Strained-Si N-Type Metal-Oxide-Semiconductor Field-Effect Transistors," IEEE Electron Device Letters, vol. 15, No. 3 (Mar. 1994), pp. 100-102.

Welser et al., "Evidence of Real-Space Hot-Electron Transfer in High Mobility, Strained-Si Multilayer MOSFETs," IEDM, pp. 545-548 (1993).

Welser et al., "NMOS and PMOS Transistors Fabricated in Strained Silicon/Relaxed Silicon-Germanium Structures," IEEE, pp. 1000-1002 (1992).

Welser, "The application of strained-silicon/relaxed-silicon germanium heterostructures to metal-oxide-semiconductor field-effect transistors," Ph.D. Thesis, Stanford University Dept. of Electrical Engineering, 1995.

Wolf and Tauber, Silicon Processing for the VLSI Era vol. 1: Process Technology, Lattice Press, Sunset Beach, CA, 1986, pp. 384-386.

Xie et al., "Semiconductor Surface Roughness: Dependence on Sign and Magnitude of Bulk Strain," Physical Review Letters, vol. 73, No. 22 (Nov. 28, 1994), pp. 3006-3009.

Xie et al., "Very high mobility two-dimensional hole gas in Si/GexSi1-x/Ge structures grown by molecular beam epitaxy," Applied Physics Letters, vol. 63, No. 16 (Oct. 18, 1993), pp. 2263-2264.

Xie, "SiGe field effect transistors," Materials Science and Engineering, vol. 25 (1999), pp. 89-121.

Yamagata et al., "Bonding, Splitting and Thinning by Porous Si in ELTRAN; SOI-Epi Wafer," Material Research Society Symposium Proceedings, vol. 681E (2001), pp. 18.2.1-18.2.10.

Yasuda et al., "Interfacial Reactions of Ti / and Zr / $Si_{1-x}Ge_x$ / Si Contacts with Rapid Thermal Annealing", *Thin Solid Films*, Volume/No. 373, 2000, pp. 73-78.

Yew, "Growth and Characterization of Low Temperature Silicon Selective Epitaxy," Ph.D. Thesis, MIT, 1990, pp. 1-210.

Yu et al., "Doping reaction of PH3 and B2H6 with Si(100)," *Journal of Applied Physics*, 59 (12) (Jun. 15, 1986), pp. 4032-4037.

Yeo et al., "Nanoscale Ultra-Thin-Body Silicon-on-Insulator P-MOSFET with a SiGe/Si Heterostructure Channel," IEEE Electron Device Letters, vol. 21, No. 4 (Apr. 2000), pp. 161-163.

Zhang et al., "Demonstration of a GaAs-Based Compliant Substrate Using Wafer Bonding and Substrate Removal Techniques," IEEE, (1998), pp. 25-28.

Abstreiter et al., "Silicon/Germainium Strained Layer Superlattices," J. Crystal Growth, 95:431-438 (1989).

Ahn et al, "Film Stress-Related Vacancy Supersaturation in Silicon Under Low-Pressure Chemical Vapor Deposited Silicon Nitride Films," 64 J. Applied Physics 4914 (1988).

AmberWave Systems Corporation's Second Supplemental Responses to Intel's Third Set of Interrogatories, U.S.D.C., District of Delaware, C.A. No. 05-301-KAJ (Jul. 12, 2006).

Augendre et al, "Elevated Source/Drain by Sacrificial Selective Epitaxy for High Performance Deep Submicron CMOS: Process Window Versus Complexity," 47 IEEE Trans. on Electron Devices 1484 (2000).

Antonelli et al, "Pressure and Strain Effects on Diffusion," 163 Mat. Res. Soc. Symp. Proc. 523 (1989).

Auberton-Hervé et al., "Smart Cut®; The Basic Fabrication Process for Unibond® SOI Wafers," IEICE Trans. on Electronics, E80-C(3):358-363 (1997).

Badenes et al, "A High Performance 0.18 um CMOS Technology Designed for Manufacturability," 1997 Proc. 27th European Solid-State Device Res. Conf. 404.

Borland et al., "Low Temperature Low Pressure Silicon Epitaxial Growth and Its Application to Advanced Dielectric Isolation Technology," 1986 Extended Abstracts 18th Int'l Conf. on Solid State Devices and Materials 53.

Carns et al, "Hole Mobility Measurements in Heavily Doped $Si_{1-x}Ge_x$ Strained Layers," 41 IEEE Trans. on Electron Devices 1273 (1994).

C. Carter et al., "Residual Defects Following Rapid Thermal Annealing of Shallow Boron and Boron Fluoride Implants into Preamorphized Silicon," 44 Applied Physics Letters 459 (1984).

Chau et al., "Advanced CMOS Transistors in the Nanotechnology Era for High-Performance, Low-Power Logic Applications," pp. 26-30 (2004).

Cowern et al., "Diffusion in Strained Si(Ge)," 72 Physical Review Letters 2585 (1994).

Czaja, "Conditions for the Generation of Slip by Diffusion of Phosphorus into Silicon," 37 J. App. Physics 3441 (1966).

Daembkes et al., "The n-Channel SiGe/Si Modulation-Doped Field-Effect Transistor," 33 IEEE Trans. on Electron Devices 633 (1986).

Eichinger et al., "Characterization of MBE Grown SiGe Superlattices with SIMS and RBS," Proc. First Int'l Symp. on Silicon Molecular Beam Epitaxy, 85(7):367-375 (1985).

Examination Report for European Patent Application No. 98 931 529.6-2203, dated Jan. 10, 2002, 4 pages.

Examination Report for European Patent Application No. 98 931 529.6-2203, dated May 9, 2003, 5 pages.

Examination Report for European Patent Application No. 01 973 651.1-1528, dated Mar. 22, 2004, 3 pages.
Examination Report for European Patent Application No. 01 989 893.1-1235, dated Aug. 16, 2004, 5 pages.
Examination Report for European Patent Application No. 01 973 651.1-1528, dated Nov. 12, 2004, 9 pages.
Examination Report for European Patent Application No. 02 709 406.9-2203, dated May 11, 2004, 3 pages.
Examination Report for European Patent Application No. 02 709 406.9-2203, dated Mar. 24, 2005, 5 pages.
Fahey et al., "Point Defects and Dopant Diffusion in Silicon," 61 Rev. Modern Physics 289 (1989).
Fair, "Concentration Profiles of Diffused Dopants in Silicon," in Impurity Doping Processes in Silicon, Chapt. 7, pp. 318-442 (1981).
Fair, "Quantified Conditions for Emitter-Misfit Dislocation Formation in Silicon," J. Electrochemical Soc'y, 125(6):923-926 (1978).
Fathy et al., "Formation of epitaxial layers of Ge on Si substrates by Ge implantation and oxidation," Applied Physics Letters, 51(17):1337-1339 (1987).
Fitzgerald et al., "Dislocations in Relaxed SiGe/Si Heterostructures," Phys. Stat. Sol. A, Applied Research, Berlin, De, vol. 171, Nr. 1, (1999) pp. 227-238.
Gaworzewski et al., "Electrical Properties of Lightly Doped p-Type Silicon-Germanium Single Crystals," 83 J. App. Physics 5258 (1998).
Ghani et al., "Effect of oxygen on minority-carrier lifetime and recombination currents in Si1-xGex heterostructure devices," Applied Physics Letters, 58(12):1317-1319 (1991).
Gibbons et al., "Limited reaction processing: Silicon epitaxy," Applied Physics Letters, 47(7):721-723 (1985).
Godbey et al., "A $Si_{0.7}Ge_{0.3}$ Strained Layer Etch Stop for the Generation of Bond and Etch Back SOI," IEEE SOS/SOI Tech. Conf. Proc., pp. 143-144 (1989).
Goo et al., "Scalability of Strained-Si n MOSFETs Down to 25 nm Gate Length," 24 IEEE Electron Device Letters 351 (2003).
Gronet et al., "Growth of GeSi/Si strained-layer superlattices using limited reaction processing," 61 J. App. Physics 6, pp. 2407-2409 (1987).
Hobart et al., "Ultra-cut: A Simple Technique for the Fabrication of SOI Substrates with Ultra-Thin (<5 nm) Silicon Films," Proc. 1998 IEEE Int'l SOI Conf., pp. 145-146 (1998).
Holländer et al., "Reduction of Dislocation Density of MBE-Grown $Si_{1-x}Ge_x$ Layers on (100) Si by Rapid Thermal Annealing," Thin Solid Films, 183:157-164 (1989).
Hopkins et al., "Enhanced Diffusion in Boron Implanted Silicon," 132 J. Electrochemical Soc'y 2035 (1985).
Hu et al., "Channel and Source/Drain Engineering in High-Performance Sub-0.1 um NMOSFETs Using X-Ray Lithography," 1994 Symp. on VLSI Tech., Dig. Tech. Papers 17.
Huang et al., "SiGe-on-insulator prepared by wafer bonding and layer transfer for high-performance field-effect transistors," Applied Physics Letters, 78(9):1267-1269 (2001).
Hull et al., "Structural Studies of GeSi/Si Heterostructures," Proc. First Int'l Symp. Silicon Molecular Beam Epitaxy, 85(7):376-384 (1985).
Intel's Responses and Objections to AmberWave's Second Set of Interrogatories, U.S.D.C., District of Delaware, C.A. No. 05-301-KAJ, Feb. 3, 2006.
Intel's Responses and Objections to AmberWave's Second Set of Requests for Production, U.S.D.C., District of Delaware, C.A. No. 05-301-KAJ, Feb. 3, 2005.
Intel's Amended and Supplemented Responses and Objections to AmberWave's Second Set of Interrogatories, U.S.D.C., District of Delaware, C.A. No. 05-301-KAJ, Aug. 7, 2006.
International Search Report for International Patent Application No. PCT/US 98/13076, dated Oct. 27, 1998, 4 pages.
International Search Report for International Patent Application No. PCT/US02/03688, dated May 7, 2002, 4 pages.
International Search Report for International Patent Application No. PCT/US03/19528, dated Sep. 23, 2003, 4 pages.
Ismail et al., "Gated Hall effect measurements in high-mobility n-type Si/SiGe modulation-doped heterostructures," Applied Physics Letters, 66(7):842-844 (1995).

Ismail et al., "Extremely high electron mobility in Si/SiGe modulation-doped heterostructures," Applied Physics Letters, 66(9):1077-1079 (1995).
Ismail et al., "Identification of a Mobility-Limiting Scattering Mechanism in Modulation-Doped Si/SiGe Heterostructures," Physical Review Letters, 73(25):3447-3452 (1994).
Jain et al., "Theoretical Calculations of the Fermi Level and of Other Parameters in Phosphorus Doped Silicon at Diffusion Temperatures," 21 IEEE Trans. on Electron Devices 155 (1974).
Kasper, "Growth and Properties of Si/SiGe Superlattices," Surface Sci., 174:630-639 (1986).
Kato, "The Annealing Time and Temperature Dependence of Electrical Dopant Activation in High-Dose $BF_2$ Ion Implanted Silicon," 141 J. Electrochemical Soc'y 3158 (1994).
King et al., "Si/$Si_{1-x}Ge_x$ Heterojunction Bipolar Transistors Produced by Limited Reaction Processing," 10 IEEE Electron Device Letters 52 (1989).
Klauk et al., "Thermal stability of undoped strained Si channel SiGe heterostructures," Applied Physics Letters, No. 68, pp. 1975-1977 (1996).
Kuo et al., "Effects of Strain on Boron Diffusion in Si and $Si_{1-x}Ge_x$," 66 Applied Physics Letters 580 (1995).
Loechelt et al., "Measurement and Modeling of Boron Diffusion in Si and Strained $Si_{1-x}Ge_x$ Epitaxial Layers During Rapid Thermal Annealing," 74 J. App. Physics 5520 (1993).
Lunnon et al., "Furnace and Rapid Thermal Annealing of P+/n Junctions in BF2+-Implanted Silicon," 132 J. Electrochemical Soc'y 2473 (1985).
Maleville et al., "Physical Phenomena Involved Involved in the Smart-Cut® Process," Electrochemical Soc'y Proc., 96(3):34-46 (1996).
Maseeh et al., "Plastic Deformation of Highly Doped Silicon," A21-A23 Sensors & Actuators 861 (1990).
Mazuré et al.,"Facet Engineered Elevated Source/Drain by Selective Si Epitaxy for 0.35 Micron MOSFETS," 1992 IEDM Tech. Dig. 853.
Mehregany et al., "Anisotropic Etching of Silicon in Hydrazine," 13 Sensors and Actuators 375 (1988).
Mieno et al., "Selective Doped Polysilicon Growth," 134 J. Electrochemical Soc'y 11, 2862-2867 (1987).
Mistry et al., "Delaying Forever: Uniaxial Strained Silicon Transistors in a 90nm CMOS Technology," Symp. on VLSI Tech., Dig. Tech.Papers, pp. 50-51 (2004).
Miyake et al., "Transient Enhanced Diffusion of Ion-Implanted Boron in Si During Rapid Thermal Annealing," 63 J. App. Physics 1754 (1988).
Mizuo et al., "Anomalous Diffusion of B and P in Si Directly Masked with $Si_3N_4$," 21 Japanese J. App. Physics 281 (1982).
Monroe et al., "Comparison of mobility-limiting mechanisms in high-mobility $Si_{1-x}Ge_x$ heterostructures," J. Vac. Sci. Tech. B, 11(4):1731-1737 (1993).
Moriya et al., "Boron Diffusion in Strained $Si_{1-x}Ge_x$ Epitaxial Layers," 71 Physical Review Letters 883 (1993).
Moriya et al., "Doping and Electrical Characteristics of In Situ Heavily B-Doped $Si_{1-x}Ge_x$ Films Epitaxially Grown Using Ultraclean LPCVD," 343-344 Thin Solid Films 541 (1999).
Murota et al., "CVD $Si_{1-x}Ge_x$ Epitaxial Growth and Its Doping Control," 27 J. Japanese Ass'n for Crystal Growth 171 (2000).
Nakahara et al., "Ultra-Shallow In-Situ-Doped Raised Source/Drain Structure for Sub-Tenth Micron CMOS," 1996 Symp. on VLSI Tech., Dig. Tech. Papers 174.
Noble et al., "Reduction in misfit dislocation density by the selective growth of $Si_{1-x}Ge_x$/Si in small areas," Applied Physics Letters, 56(1):51-53 (1990).
Noda et al., "Doping and Electrical Characteristics of In-Situ Heavily B-Doped $Si_{1-x-y}Ge_xC_y$ Films Epitaxially Grown Using Ultraclean LPCVD," 380 Thin Solid Films 57 (2000).
Noh et al., "Contact Resistivity Between Tungsten and Impurity (P and B)-doped $Si_{1-x-y}Ge_xC_y$ Epitaxial Layer," 212-213 Applied Surface Sci. 679 (2003).
Notice of Preliminary Rejection for Korean Patent Application No. 10-1999-7012279, dated Feb. 21, 2002, 2 pages (English translation attached).

Notice of Final Rejection for Korean Patent Application No. 10-1999-7012279, dated Feb. 25, 2003, 2 pages (English translation attached).

Patton et al., "Silicon-Germanium-Base Heterojunction Bipolar Transistors by Molecular Beam Epitaxy," 9 IEEE Electron Device Letters 165 (1988).

Powell, "Activation of Shallow, High-Dose $BF^{2+}$ Implants into Silicon by Rapid Thermal Processing," 56 J. App. Physics 2837 (1984).

Rim et al., "Characteristics and Device Design of Sub-100 nm Strained Si N- and PMOSFETs," 2002 Symp. on VLSI Tech., Dig. Tech. Papers 98.

Rim et al., "Low Field Mobility Characteristics of Sub-100 nm Unstrained and Strained Si MOSFETs," 2002 IEDM Tech. Dig. 43.

Rim et al., "Strained Si NMOSFETs for High Performance CMOS Technology," 2001 Symp. on VLSI Tech., Dig. Tech. Papers 59.

Rodrigues et al., "Strain Compensation by Heavy Boron Doping in $Si_{1-x}Ge_x$ Layers Grown by Solid Phase Epitaxy," 12 J. Mat. Res. 1698 (1997).

Rosenblad et al., "Strain relaxation of graded SiGe buffers grown at very high rates," Mat. Sci. and Engineering, B71 (2000) pp. 20-23.

Ryssel et al., "High Concentration Effects of Ion Implanted Boron in Silicon," 22 Applied Physics 35 (1980).

Schäffler, "Letter to the Editor, High-electron-mobility Si/SiGe heterostructures: influence of the relaxed SiGe buffer layer," Semicond. Sci. Tech., 7:260-266 (1992).

Schumann et al., "Impact of Elevated Source/Drain on the Reverse Short Channel Effect," 1999 Proc. 29th European Solid-State Device Res. Conf. 572.

Shifren et al., "Drive current enhancement in p-type metal-oxide-semiconductor field-effect transistors under shear uniaxial stress," Applied Physics Letters, 85(25):6188-6190 (2004).

Simard-Normandin, "Electrical Characteristics and Contact Resistance of $B^+$- and $BF^{2+}$- Implanted Silicon Diodes with Furnace and Rapid Thermal Annealing," 32 IEEE Trans. on Electron Devices 1354 (1985).

Solmi et al., "High-Concentration Boron Diffusion in Silicon: Simulation of the Precipitation Phenomena," 68 J. App. Physics 3250 (1990).

Stach et al., "Anomalous Boron Diffusion in Silicon from Planar Boron Nitride Sources," 121 J. Electrochemical Soc'y 722 (1974).

Subbanna et al., "How SiGe Evolved into a Manufacturable Semiconductor Production Process," IEEE Int'l Solid-State Circuits Conf., pp. 56, 67, 446 (1999).

Sugiyama et al., "Formation of strained-silicon layer on thin relaxed-SiGe/$SiO_2$/Si structure using SIMOX technology," Thin Solid Films, 369:199-202 (2000).

Sun et al., "Elevated n+/p Junctions by Implant into CoSi2 Formed on Selective Epitaxy for Deep Submicron MOSFET's," 45 IEEE Trans. on Electron Devices 1946 (1998).

Taraschi et al., "Relaxed SiGe on Insulator Fabricated via Wafer Bonding and Layer Transfer: Etch-Back and Smart-Cut Alternatives," Electrochemical Soc'y Proc., 2001(3):27-32 (2001).

Taraschi et al., "Strained-Si-on-Insulator (SSOI) and SiGe-on-Insulator (SGOI): Fabrication Obstacles and Solutions," Mat. Res. Soc. Symp. Proc., 745:105-110 (2003).

Taraschi et al., "Relaxed SiGe-on-insulator fabricated via wafer bonding and etch back," J. Vac. Sci. Tech. B, 20(2):725-727 (2002).

Tsai et al., "Recrystallization of Implanted Amorphous Silicon Layers. I. Electrical Properties of Silicon Implanted with $BF^+_2$ or $Si^+ + B^{+8}$)," 50 J. App. Physics 183 (1979).

van Dort et al., "Influence of High Substrate Doping Levels on the Threshold Voltage and the Mobility of Deep-Submicrometer MOSFET's," 39 IEEE Trans. on Electron Devices 932 (1992).

van Meer et al.,"High Performance Raised Gate/Source/Drain Transistors for Sub-0.15 μm CMOS Technologies," 1999 Proc. 29th European Solid-State Device Res. Conf. 388.

Waite et al., " A Novel Deep Submicron Elevated Source/Drain MOSFET," pp. 148-151.

Walker et al., "Shallow Boron Junctions and Preamorphization for Deep Submicron Silicon Technology," 73 J. App. Physics 4048 (1993).

Wang, "Identification and Measurement of Scaling-Dependent Parasitic Capacitances of Small-Geometry MOSFET's," 43 IEEE Trans. on Electron Devices 965 (1996).

Wong, "Beyond the Conventional Transistor," 46 IBM J. Res. & Dev. 133 (2002).

Request for *Ex Parte* Reexamination of U.S. Patent No. 7,122,449, Oct. 17, 2006.

Aoki et al., "Optimum Crystallographic Orientation of Submicron CMOS Devices," 1985 IEDM 577-580.

Bowling, "Single-Wafer Processing and Real-Time Process Control for Semiconductor Integrated Circuit Manufacturing," 1994 Int'l Symp. on Semiconductor Manufacturing, pp. 31-33.

Chau, "A 50 nm Depleted-Substrate CMOS Transistor (DST)," 2001 IEDM 621-624.

Saddow et al., "Lateral Epitaxial Overgrowth and Pendeo Epitaxy of 3C-SiC on Si Substrates," 1999 Int'l Conf. on SiC and Related Materials.

Steegen et al., "Silicide Induced Pattern Density & Orientation Dependent Transconductance in MOS Transistors," 1999 IEDM, pp. 497-500.

Wolf and Tauber, Silicon Processing for the VLSI Era vol. 1: Process Technology, 2nd Ed., 2000, p. 203, Table 6-3.

AmberWave Systems Corporation's Responses to Intel's Second Set of Requests for Production, U.S.D.C., District of Delaware, C.A. No. 05-301-KAJ, (Feb. 3, 2006).

AmberWave Systems Corporation's Responses to Intel's Third Set of Interrogatories, U.S.D.C., District of Delaware, C.A. No. 05-301-KAJ (consolidated), (Feb. 3, 2006).

AmberWave Systems Corporation's First Supplemental Responses to Intel's Third Set of Interrogatories, U.S.D.C., District of Delaware, C.A. No. 05-301-KAJ (consolidated), (Mar. 27, 2006).

AmberWave Systems Corporation's Responses to Intel's Third Set of Requests for Production, U.S.D.C., District of Delaware, C.A. No. 05-301-KAJ (consolidated), (Feb. 10, 2006).

AmberWave Systems Corporation's Responses to Intel's Fourth Set of Interrogatories, U.S.D.C., District of Delaware, C.A. No. 05-301-KAJ (consolidated), (Feb. 27, 2006).

AmberWave Systems Corporation's Responses to Intel's Fifth Set of Requests for Production, U.S.D.C., District of Delaware, C.A. No. 05-301-KAJ (consolidated), (Jun. 30, 2006).

AmberWave Systems Corporation's Responses to Intel's Fifth Set of Interrogatories, U.S.D.C., District of Delaware, C.A. No. 05-301-KAJ (consolidated), (Jun. 19, 2006).

Intel's Responses and Objections to AmberWave's Fourth Set of Requests for Production, U.S.D.C., District of Delaware, C.A. No. 05-301-KAJ (consolidated), Aug. 17, 2006.

US 7,439,164 B2

METHODS OF FABRICATING SEMICONDUCTOR STRUCTURES HAVING EPITAXIALLY GROWN SOURCE AND DRAIN ELEMENTS

CROSS-REFERENCE TO RELATED APPLICATIONS

This application is a continuation application of U.S. application Ser. No. 11/103,681 filed Apr. 12, 2005, now U.S. Pat. No. 7,122,449 which is a continuation of U.S. application Ser. No. 10/458,544 filed Jun. 10, 2003, now U.S. Pat. No. 6,946,371 which claims priority and the benefit of U.S. Provisional Application Ser. No. 60/387,867 filed Jun. 10, 2002; the entire disclosures of these three applications are incorporated herein by reference.

FIELD OF THE INVENTION

The present invention relates generally to semiconductor fabrication methods and, more specifically, to methods for fabricating semiconductor devices having substantially facetless raised source and drain elements.

BACKGROUND

In order to improve performance and packing density of modern microelectronic devices, it is often desirable to reduce channel lengths of metal-oxide-semiconductor-field-effect transistors ("MOSFETs") during device design. As the MOSFET channel length decreases, however, short channel effects and parasitic resistance become of increasing concern. To minimize short channel effects in bulk silicon devices, for example, the source/drain doping junction depths are decreased during scaling. But shallower junctions require the use of thinner silicides to minimize leakage current from the silicon/silicide interface to the junction depletion region, which, at the same time, may increase parasitic contact resistances. As another example, to improve performance of a silicon-on-insulator ("SOI") device by reducing short channel effects, its silicon region should preferably be less than about 20 nm thick. Conventional silicide formation processes, however, may consume substantially the entire silicon layer of such thickness, which may, in turn, result in undesirably large leakage currents and parasitic contact resistance because the silicide/silicon interface area is small.

The increasing operating speeds and computing power of microelectronic devices have recently given rise to the need for an increase in the complexity and functionality of the semiconductor substrates that are used as the starting substrate in these microelectronic devices. Such "virtual substrates" based on silicon and germanium provide a platform for new generations of VLSI devices that exhibit enhanced performance when compared to devices fabricated on bulk Si substrates. Specifically, new technological advances enable formation of heterostructures using silicon-germanium alloys (hereinafter referred to as "SiGe" or "$Si_{1-x}Ge_x$") to further increase performance of the semiconductor devices by changing the atomic structure of Si to increase electron mobility. These substrates are called strained Si substrates.

A strained Si substrate is generally formed by a first epitaxial growth of a relaxed SiGe layer on bulk Si, and then a second epitaxial growth of a thin (less than about 500 Å) Si layer on the relaxed SiGe layer. Because the lattice constant of relaxed SiGe heterostructure is different from Si, the thin Si layer becomes "strained," resulting in enhanced mobilities (and hence improved device speeds) over bulk Si. The percentage of Ge in SiGe, and the method of deposition can have a dramatic effect on the characteristics of the strained Si layer. U.S. Pat. No. 5,442,205, "Semiconductor Heterostructure Devices with Strained Semiconductor Layers," incorporated herein by reference, demonstrates one such method of producing a strained Si device structure.

A method of epitaxially growing a relaxed SiGe layer on bulk Si is discussed in international application WO 01/22482, "Method of Producing Relaxed Silicon Germanium Layers," incorporated herein by reference. The method includes providing a monocrystalline Si substrate, and then epitaxially growing a graded $Si_{1-x}Ge_x$ layer with increasing Ge concentration at a gradient of less than 25% Ge per micron to a final composition in the range of $0.1<x<1$, using a source gas of $Ge_xH_yCl_z$ for the Ge component, on the Si substrate at a temperature in excess of 850° C., and then epitaxially growing a semiconductor material on the graded layer.

Another method of epitaxially growing a relaxed SiGe layer on bulk Si is discussed in a paper entitled, "Low Energy plasma enhanced chemical vapor deposition," by M. Kummer et. al. (Mat. Sci. & Eng. B89, 2002, pp. 288-95), incorporated herein by reference, in which a method of low-energy plasma-enhanced chemical vapor deposition (LEPECVD) is shown, which allows the formation of a SiGe layer on bulk Si at high growth rates (0.6 micron per minute) and low temperatures (500-750° C.).

To grow a high-quality, thin, epitaxial strained Si layer on a graded SiGe layer, the SiGe layer is, preferably, planarized to reduce the surface roughness in the final strained Si substrate. Current methods of chemical mechanical polishing (CMP) are typically used to improve the planarity of surfaces in semiconductor fabrication processes. U.S. Pat. No. 6,107,653, "Controlling Threading Dislocations in Ge on Si Using Graded GeSi Layers and Planarization," incorporated herein by reference, describes how planarization can be used to improve the quality of SiGe graded layers.

Although the resulting biaxial tensile or compressive strain alters the carrier mobilities in the layers of the "virtual substrate" enabling the fabrication of high-speed and/or low-power devices, short channel effects and parasitic resistance remain of concern for strained-Si-based devices as well.

Raised source/drain structures have been proposed as a technique for forming high-quality contacts to improve performance of bulk silicon, silicon-on-insulator (SOI), and strained silicon devices. Raised source/drains are generally fabricated by raising the level of the source and drain regions by selective semiconductor, e.g., silicon, deposition. The extra silicon increases the process margin for the silicide process and extends the latitude for contact junction design. To maintain a similar crystalline structure, the extra silicon is "grown" by silicon epitaxy.

For example, in bulk and strained Si devices, raised source/drain contacts have been proposed as a means of forming shallow dopant junctions to minimize contact resistances and short channel effects. In SOI devices, the raised source and drain regions provide sacrificial silicon useful for silicide consumption to form low resistance contacts on thin Si films.

Typically, source and drain regions are formed by selective epitaxial silicon growth after formation of a sidewall dielectric spacer of silicon dioxide ($SiO_2$), silicon nitride ($Si_3N_4$), or a combination of both materials. In this process, silicon is epitaxially grown on exposed windows in a dielectric mask while nucleation of polysilicon on the masking material is suppressed during the incubation time by, for example, etching of spurious nuclei on the dielectric material by hydrogen chloride, the mediation of saturation by formation of a number of intermediate chlorine-containing silicon precursors, and passivation of surface defect sites which serve as heterogeneous nucleation centers. Also, selectivity is facilitated by growing for a period of time that is generally shorter than the incubation period needed for polysilicon nucleation on the dielectric mask.

The dielectric spacer electrically isolates a gate made of, for example, polysilicon, from the source and drain regions. After the selective epitaxial growth step, a heavy low-energy implant forms a doped region, and is followed by a silicidation process for, e.g., low resistance complementary metal-oxide-semiconductor (CMOS) contacts.

During selective epitaxial growth, however, decreased thickness of the epitaxial layer typically occurs at interfaces between the epitaxial layer and the dielectric spacer or field oxide, where facets form by growth of low-energy crystal planes that minimize the energetically less favorable epitaxial Si/dielectric material interface. Because the raised source/drain regions grow thinner near the dielectric spacer edge, faceting leads to non-planar device layers. This phenomenon raises processing concerns in bulk Si, SOI, and strained Si devices by complicating implementation of selective epitaxial growth in device applications. Specifically, thinner faceted regions cause localized deeper dopant penetration during ion implantation, which increases short channel effects and leakage currents. Also, thinner faceted regions typically result in deeper silicide penetration and greater Si consumption during silicidation. Thus, faceting may result in poor doping profile control and poor silicide depth control, leading to degraded device characteristics and more complex device designs.

For example, referring to FIG. 1, a cross-sectional transmission electron microscope (XTEM) image illustrates undoped Si layers 10 grown adjacent to reactive ion etched <110>-oriented $SiO_2$ sidewalls 12. The SiGe layers 14 were included as markers to track facet development and evolution. The selective Si epitaxy has noticeable (311)-oriented facets 15 and (110)-oriented facets 17 next to $SiO_2$ sidewalls. Such faceting would be detrimental during implant and silicidation of source and drain regions. Referring to FIG. 2, a silicided source region 20 is formed by selective epitaxial growth on a thin film SOI substrate 22 according to any method known in the art. Such faceted growth leads to deep penetration of a silicide 24 to a buried $SiO_2$ layer 26. This penetration may dramatically increase the contact resistance because the silicide/silicon channel interfacial area is reduced, which leads to poor device characteristics. The electrical contact to the device channel is made through the area adjacent to the spacer 28, which is only the width of the Si channel. Furthermore, the contact quality may degrade because of incomplete silicide formation if the thickness of consumed Si is insufficient.

Similarly, in strained-Si-based devices, thinner faceted raised source and drain regions may cause the silicide to penetrate into a relaxed silicon-germanium (SiGe) layer underneath a strained Si layer. This may result in formation of a poor quality silicide because of the rejection of Ge during alloying of the SiGe layer with the silicide metal. This rejection may create high-resistivity regions that compromise the contact quality.

Facetless selective epitaxial growth is, therefore, desirable for fully realizing the performance advantages of the raised source/drain scheme for fabrication of low-resistance contacts and shallow junctions in advanced devices that have wide ranging application to Si, SOI, and strained Si technologies.

Recently, facetless epitaxy has received much attention in the design of raised source/drain contacts for CMOS applications. For example, selective growth in inverse patterns, i.e. using $SiO_2$ pillars with a Si field as opposed to Si windows in a $SiO_2$ field, has been proposed. Another approach involves fabrication of facetless raised source/drain structures by selective epitaxial growth in commercially available low-pressure and atmospheric-pressure chemical vapor deposition systems by carefully controlling the geometry of the multilayer spacer structure and sidewall spacer profile. For example, it has been suggested that undercutting the liner oxide and silicon growth under the silicon nitride spacer recesses the silicon-liner oxide interaction away from the source/drain region. This gives extra thickness in the source/drain region before the increase in silicon-dielectric interface energy causes the epitaxial layer to facet.

In yet another approach, discussed in a thesis entitled "Selective SiGe Nanostructures" by Tom Langdo (Ph.D. Thesis, MIT, 2001)("Langdo thesis"), incorporated herein by reference, facetless growth was demonstrated by in situ n-type doping of a silicon layer being deposited by selective epitaxy adjacent to a sidewall of a reactive ion etched $SiO_2$ spacer in a ultra-high vacuum chemical vapor deposition (UHVCVD) system. It was demonstrated that a combination of moderate n-type doping and relatively vertical $SiO_2$ sidewalls results in facet-free epitaxy along <110>-oriented $SiO_2$ sidewalls. Referring to FIG. 3, an XTEM image illustrates growth of $1\times10^{18}/cm^3$ n-type doped Si with $Si_{0.9}Ge_{0.1}$ marker layers on <110>-oriented $SiO_2$ sidewalls. As shown in FIG. 3, all $Si_{0.9}Ge_{0.1}$ marker layers follow (100) planes, and thus, facet formation is suppressed during the growth. $SiO_2$ was chosen as the sidewall material instead of more commonly used $Si_3N_4$ because selective growth generally cannot be achieved with either $SiH_4$ or $SiH_2Cl_2$ source gases, common Si precursors, on $Si_3N_4$ spacers without the addition of hydrogen chloride. Because of the deleterious effects of chloride on a UHVCVD system, however, addition of hydrogen chloride to the source gases is impractical.

Obstacles hinder the commercialization of this UHVCVD growth approach. First, UHVCVD is generally not feasible for large-scale commercial applications. Second, UHVCVD selective growth is not possible with $Si_3N_4$ dielectric materials. Finally, the UHVCVD process described above is generally not compatible with multi-layered commercial spacer structures that include, e.g., $Si_3N_4$ materials.

Thus, there remains a need in the art for a process of fabricating semiconductor devices having facetless raised source/drain structures that is compatible with existing semiconductor manufacturing processes, systems, and materials and that also possesses improved process tolerances.

SUMMARY OF THE INVENTION

It is an object of the present invention to provide a process for fabricating facetless semiconductor structures that overcomes the limitations of known processes. Specifically, it is an object of the invention to provide a process for fabricating semiconductor devices having facetless raised source/drain structures that complements existing epitaxial processes and does not require stringent control of the geometry of the dielectric regions. It is also desirable that such process be less expensive in comparison to the manufacturing processes known in the art and not limited to a particular dielectric or semiconductor material.

Accordingly, methods for fabricating facetless semiconductor structures using commercially available chemical vapor deposition systems are disclosed herein. A key aspect of the invention includes selectively depositing an epitaxial layer of at least one semiconductor material on the semiconductor substrate while in situ doping the epitaxial layer to suppress facet formation. Suppression of facet formation during selective epitaxial growth by in situ doping of the epitaxial layer at a predetermined level rather than by manipulating spacer composition and geometry alleviates the stringent requirements on the device design. For example, in various embodiments of the fabrication methods according to the invention, it is not necessary to precisely control the liner oxide undercut beneath the silicon nitride spacer prior to epitaxial growth to minimize faceting, thus making the process more robust and compatible with very thin spacer dimensions. Accordingly, in situ doping during epitaxial growth to suppress faceting increases tolerance to variability during the spacer fabrication, providing an improved robust process suitable for volume manufacturing.

Throughout the following description, the term "facet" is used to refer generally to a slanted low-energy crystal plane formed in a semiconductor material at its interface with a dielectric material. Further, the term "epitaxy" is used to refer generally to methods for growing thin layers of single crystal materials on a single crystal substrate whereby crystallographic structure of the substrate is reproduced in the deposited material. Also, the term "MOS" is used to refer generally to semiconductor devices that include a conductive gate spaced at least by an insulating layer from a semiconducting channel layer. Conversely, the terms "MOSFET" or "MOS transistor" refer to a field-effect transistor having a conductive gate spaced at least by an insulating layer from a semiconducting channel layer. The terms "SiGe" and "$Si_{1-x}Ge_x$" are used interchangeably to refer to silicon-germanium alloys. The term "silicide" is here used to refer to a reaction product of a metal, silicon, and optionally other components, such as germanium. The term "silicide" is also used, less formally, to refer to the reaction product of a metal with an elemental semiconductor, a compound semiconductor or an alloy semiconductor. The term "doping" is used to refer generally to the process of adding impurities to a semiconductor material to achieve desired properties.

In general, in one aspect, the invention is directed to a method of fabricating a semiconductor structure including the steps of providing a chamber and providing a semiconductor substrate in the chamber. The semiconductor substrate has a surface including a first portion and a second portion proximal to the first portion. The method of the invention also includes forming a dielectric region on the first portion of the substrate and selectively depositing an epitaxial layer of at least one semiconductor material on the second portion of the substrate while in situ doping the epitaxial layer. The in situ doping occurs at a first predetermined level to substantially suppress facet formation thereby forming a substantially facetless semiconductor region. The pressure in the chamber during selective deposition of the epitaxial layer is greater than about 5 Torr.

In one embodiment of the invention, the epitaxial layer is deposited in a chemical vapor deposition system, such as, for example, a reduced-pressure chemical vapor deposition system, atmospheric-pressure chemical vapor deposition system, or plasma-enhanced chemical vapor deposition system.

In another embodiment of the invention, the step of selectively depositing an epitaxial layer includes introducing a source gas into the chamber. The source gas may include at least one precursor gas and a carrier gas, such as, for example hydrogen. According to one feature of this embodiment, the at least one precursor gas includes a silicon precursor gas, such as, for example, silane, disilane, trisilane, or dichlorosilane. According to another feature of this embodiment, the at least one precursor gas includes a germanium precursor gas, such as, for example, germane, digermane, germanium tetrachloride, or germanium dichloride. According to yet another feature of this embodiment, in addition to the at least one precursor gas and a carrier gas, the source gas also includes an etchant for suppressing nucleation of the at least one semiconductor material over the dielectric region during deposition. The etchant may include hydrogen chloride or chlorine.

In yet another embodiment of the invention, the epitaxial layer is doped by adding a dopant to the epitaxial layer during deposition of the epitaxial layer. Examples of suitable dopants are phosphorus, arsenic, antimony, and boron. The dopant may be added to the epitaxial layer by introducing a dopant gas, such as phosphine, arsine, stibine, and diborane, into the chamber. According to one feature of this embodiment, the first predetermined level of doping ranges from about $10^{17}$ to about $10^{19}$ cm$^{-3}$ The epitaxial layer may include at least one of silicon and germanium. Also, the dielectric region may include at least one of silicon oxide and silicon nitride. Optionally, the dielectric region may have a two-layered spacer structure including a silicon oxide layer and a silicon nitride layer disposed thereon.

In some embodiments of the invention, the semiconductor substrate includes silicon. In other embodiments, the semiconductor substrate may include a silicon wafer; an insulating layer disposed thereon; and a strained semiconductor layer, for example, silicon or germanium, disposed on the insulating layer. Alternatively, the semiconductor substrate may include a silicon wafer; a compositionally uniform relaxed $Si_{1-x}Ge_x$ layer deposited thereon; and a strained silicon layer deposited on the relaxed $Si_{1-x}Ge_x$ layer. In this embodiment, the semiconductor substrate may also include a compositionally graded $Si_{1-x}Ge_x$ layer disposed between the compositionally uniform relaxed $Si_{1-x}Ge_x$ layer and the silicon wafer, or an insulating layer disposed between the compositionally uniform relaxed $Si_{1-x}Ge_x$ layer and the silicon wafer.

In still another embodiment of the invention, the temperature in the chamber during selective deposition of the epitaxial layer ranges from about 300° C. to about 900° C., for example, from about 500° C. to about 700° C. Also, the epitaxial layer may be deposited at a rate greater than about 1 nm/min.

In one embodiment of the invention, the method includes the steps of fabricating an n-channel MOSFET in a first portion of the semiconductor region; and fabricating a p-channel MOSFET in a second portion of the semiconductor region. According to one feature of this embodiment, the method includes counter-doping the first portion or the second portion at a second predetermined level. Optionally, the first predetermined level of doping does not exceed the second predetermined level of doping.

In some embodiments, the method of the invention also includes forming a metal silicide layer over the semiconductor region. The surface of the semiconductor substrate may have a substantially (100) crystallographic orientation. Also, the dielectric region may include a sidewall having an angle relative to the semiconductor substrate that ranges from about 60° to about 90°. The sidewall may be substantially aligned with either the <110> crystallographic plane or the <100> crystallographic plane of the semiconductor substrate.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

In the following description, various embodiments of the present invention are described with reference to the following drawings, in which.

DETAILED DESCRIPTION

In various embodiments of the invention, facetless semiconductor structures, for example, raised source and drain elements of a MOSFET, are fabricated by selective epitaxial growth proximate commonly used spacer structures, such as those including Si$_3$N$_4$, SiO$_2$, or both, using commercially available chemical vapor deposition systems. Facet formation in the epitaxial layer is suppressed by doping the epitaxial layer at a predetermined level in situ during epitaxial growth, which increases tolerance to variability during the spacer fabrication process.

Figure 1:
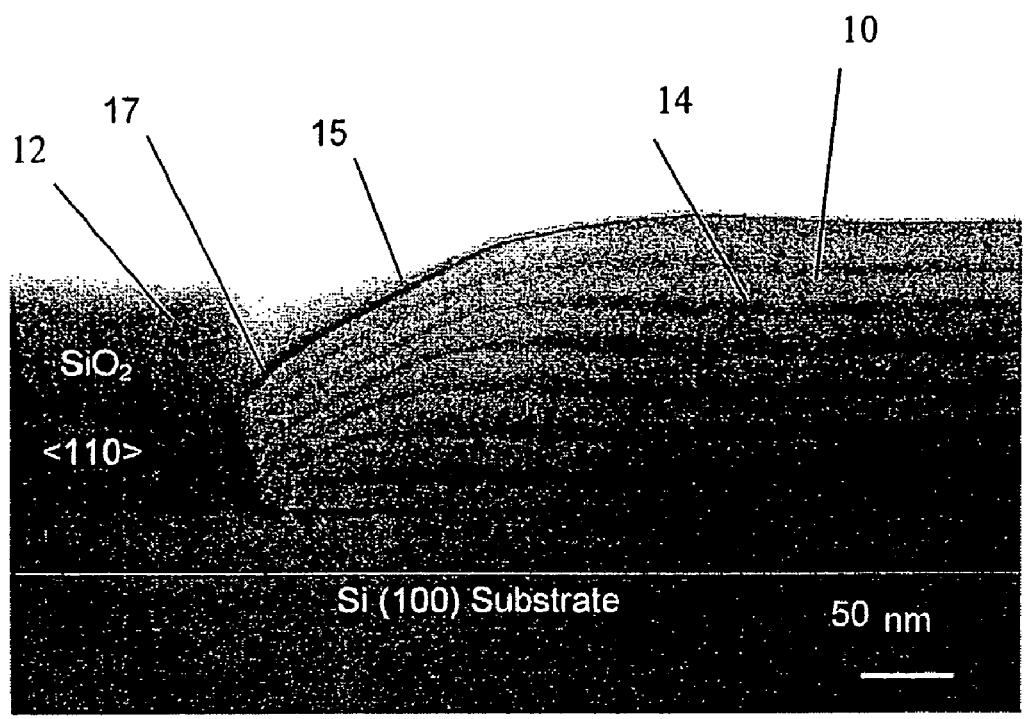
FIG. 1 depicts an XTEM image illustrating faceted selective epitaxial growth of alternating Si and SiGe layers proximate a sidewall of a SiO$_2$ spacer according to methods known in the art
Figure 2:
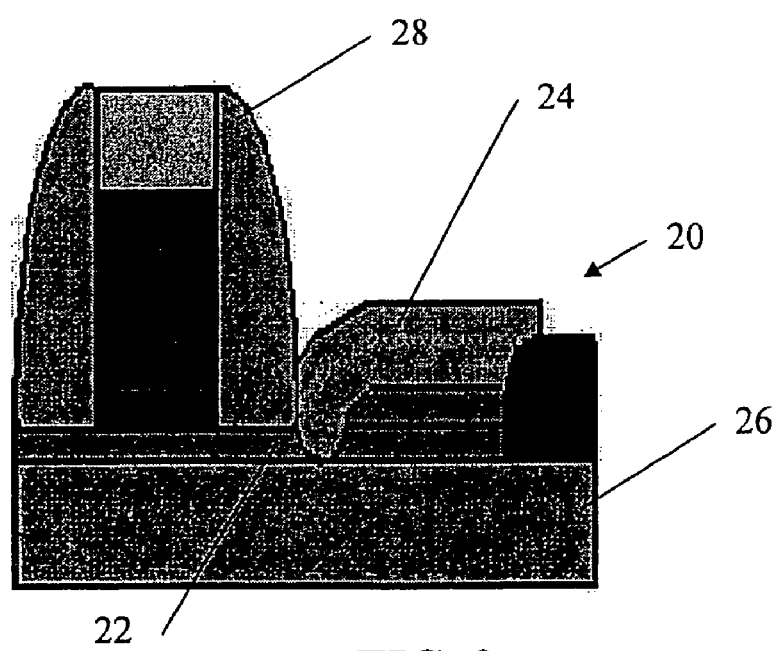
FIG. 2 depicts a cross-sectional schematic view of a semiconductor device having a faceted raised source region according to methods known in the art.
Figure 3:
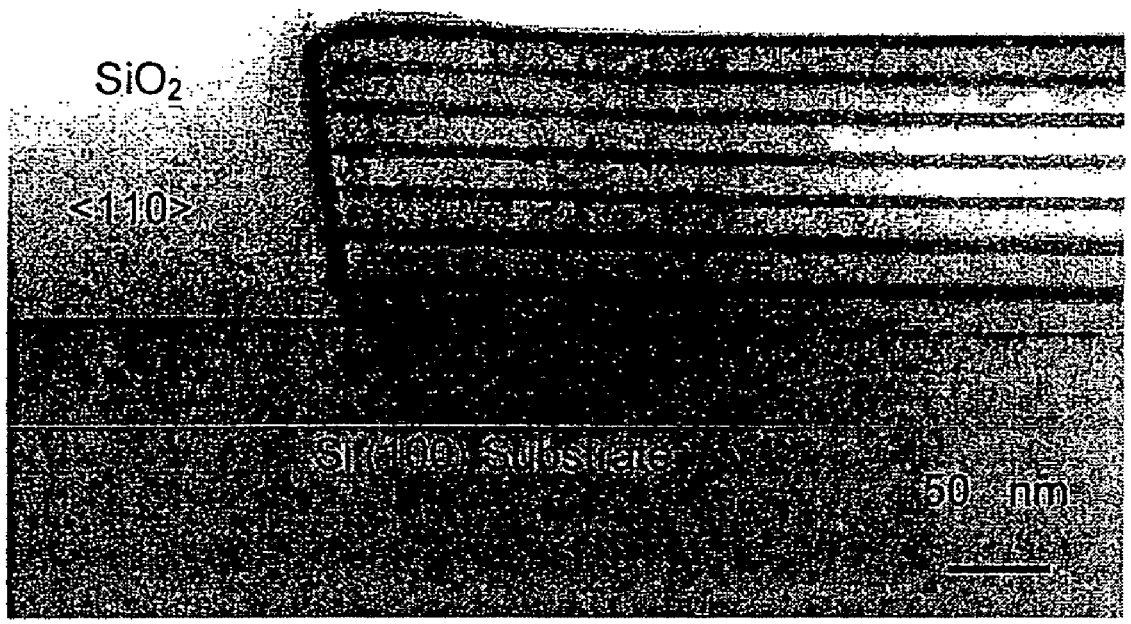
FIG. 3 depicts an XTEM image illustrating facetless selective epitaxial growth according to one method known in the art.
Figure 4:
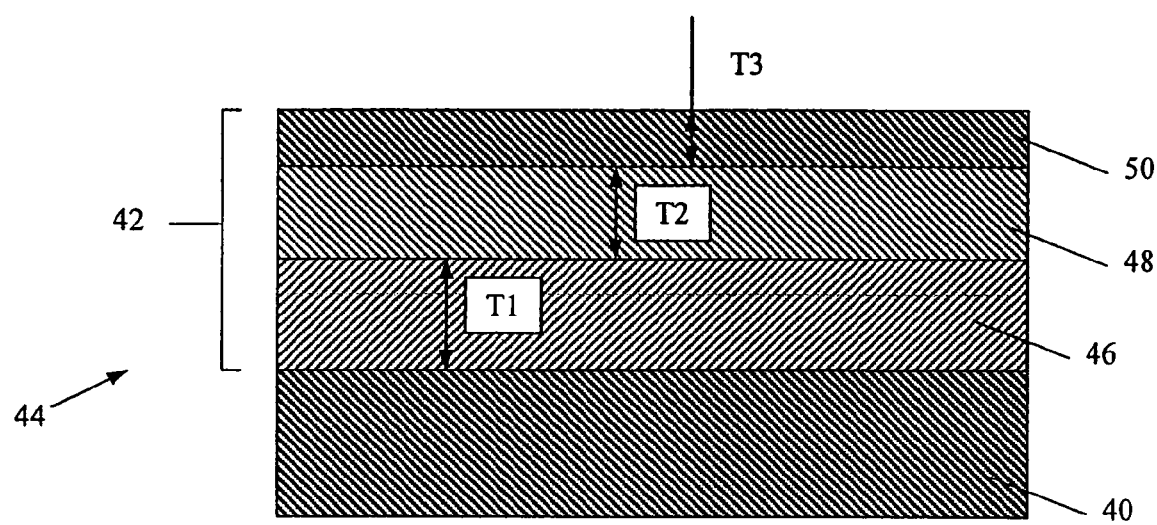
FIG. 4 depicts a cross-sectional view of a semiconductor substrate suitable for use with various embodiments of the invention.

Referring to FIG. 4, a substrate 40 suitable for use with the invention, comprises a semiconductor, such as silicon or silicon deposited over an insulator, such as, for example, SiO$_2$. In one embodiment, several layers collectively indicated as 42 are formed on the substrate 40. The layers 42 may be grown, for example, in a CVD system, including a reduced-pressure chemical vapor deposition system (LPCVD), atmospheric-pressure chemical vapor deposition system (APCVD), and plasma-enhanced chemical vapor deposition system (PECVD). In this embodiment, the layers 42 and the substrate 40 may be referred to together as a "semiconductor substrate 44."

The layers 42 include a graded layer 46 disposed over the substrate 40. The graded layer 46 may include SiGe with a grading rate of, for example, 10% Ge/μm of thickness, with a thickness T1 of, for example, 2-9 μm, and grown, for example, at 600-1100° C. A relaxed layer 48 is disposed over the graded layer 46. The relaxed layer 48 may include, for example, Si$_{1-x}$Ge$_x$ with a uniform composition containing, for example, 20-90% Ge, (i.e., $0.2 \leq x \leq 0.9$) having a thickness T2 ranging from, e.g., about 0.2 μm to about 2 μm. In an alternative embodiment, the relaxed layer 48 may be formed directly on the substrate 40, without the graded layer 46.

A tensilely strained layer 50 is disposed over relaxed layer 48, sharing an interface therewith. In one embodiment, the tensilely strained layer 50 is formed of silicon. In other embodiments, the tensilely strained layer 50 may be formed of SiGe, or at least one of a group II, a group III, a group V, and a group VI element. The tensilely strained layer 50 may have a starting thickness T3 ranging, for example, from about 50 angstroms to about 300 angstroms (Å).

In some embodiments, a compressively strained layer (not shown) may be disposed between the relaxed layer 48 and the tensilely strained layer 50. In an embodiment, the compressively strained layer includes Si$_{1-y}$Ge$_y$ with a Ge content (y) higher than the Ge content (x) of the relaxed Si$_{1-x}$Ge$_x$ layer 48. The compressively strained layer may contain, for example 40-100% Ge and have a thickness ranging, e.g., from about 10 angstroms to about 200 angstroms (Å).

Figure 5:
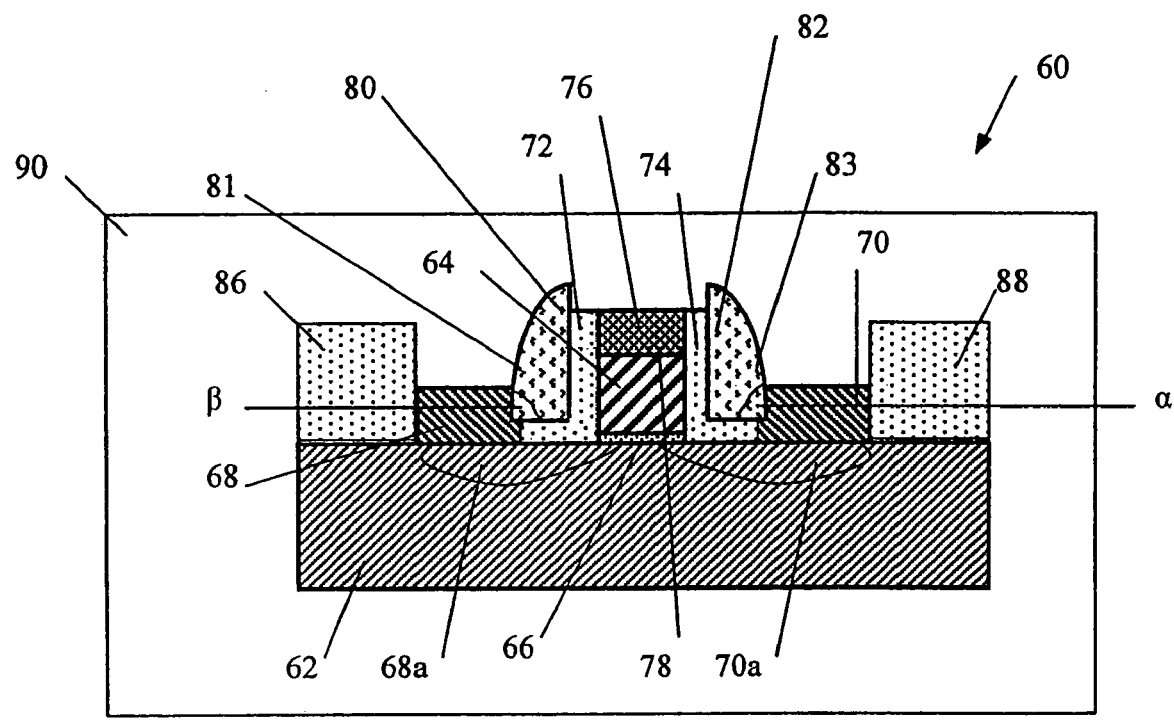
FIG. 5 depicts a cross-sectional view of a semiconductor device having selectively grown and in situ doped facetless Si source/drain epitaxial layers according to the invention.

Referring to FIG. 5, in one embodiment, a semiconductor device, such as, for example, a transistor 60 having facetless raised source/drain regions is fabricated in a chamber 90 of a chemical vapor deposition system, such as, for example, LPCVD, APCVD, or PECVD system. The transistor 60 is formed on a semiconductor substrate 62 including, for example, silicon, silicon-on-insulator, or strained silicon, as described in detail above. The surface of the semiconductor substrate may have a substantially (100) crystallographic orientation.

In a particular variation of this embodiment of the invention, prior to MOSFET fabrication, the substrate 62 is cleaned using, for example, a dilute RCA process known in the art, in order to remove organic contaminants, particles, and any ionic or heavy metal contaminants from the substrate surface. Alternatively, or in addition to the RCA cleaning, the surface of the substrate may be passivated with hydrogen using a dilute hydrofluoric acid treatment. In yet another variation, a sacrificial SiO$_2$ layer may be grown on the substrate thermally or by an oxygen plasma and then completely removed by hydrofluoric acid. In still another variation, a non-selective dry-etch process can be used. The clean surface must be achieved while minimizing substrate consumption to ensure compatibility with thin film materials heterostructures and SOI wafers. Prior to epitaxial growth the substrate may be subjected to a high temperature bake step to remove any residual oxide on the surface. For example, after hydrogen passivation with a dilute HF treatment a suitable bake could include heating the substrate for 5 minutes at 800° C.

The transistor 60 includes a gate electrode 64, made of, for example, polycrystalline silicon, and a gate insulator 66 made of, for example, SiO$_2$ or a high-k material, patterned using, for example, reactive ion etching ("RIE") whereby SiO$_2$ gate insulator is defined by selective reactive ion etching using, e.g. CHF$_3$/O$_2$ gas mixture with subsequent post-RIE cleaning to remove the growth-inhibiting fluoropolymer layer, as described in the above-referenced Langdo thesis.

Isolation regions 86, 88, made of, e.g., SiO$_2$, are introduced to isolate transistor 60 from other devices. Isolation regions 86,88 can be, for example, shallow trench isolation regions produced early in the transistor fabrication process by methods known in the art.

The transistor 60 also includes a source region 68 and a drain region 70 defined in the substrate 60 proximate the gate electrode 64. In a particular embodiment, the transistor 60 is an n-type MOSFET with the source and drain regions formed by n-type doping via, e.g. implantation of arsenic ions, as will be described in detail below. Shallow extension regions 68a, 70a of the source region 68 and the drain region 70, respectively, are formed by, e.g., ion implantation after the gate electrode 64 and the gate insulator 66 are defined. The shallow extension regions 68a, 70a preferably extend to and, in one variation of this embodiment, slightly below the gate insulator 66. The depth of the extension regions 68a, 70a may range from about 5 nm to about 50 nm. A first liner 72 and a second liner 74 are deposited proximate the gate electrode 64 and the gate insulator 66. In a particular embodiment, the thickness of the liners 72, 74 is approximately 250 angstroms. The liners 72, 74 may be formed of, e.g., a low temperature oxide (LTO). During the formation of liners 72, 74, a hard mask 76 is formed on a top surface 78 of the gate electrode 64. Hard mask 76 is formed of, e.g., LTO.

Subsequently, spacers 80, 82 are formed proximate liners 72, 74 to electrically isolate the gate and source/drain regions during the device operation. The spacers 80, 82 are formed of a dielectric such as, for example, $Si_3N_4$, by chemical vapor deposition followed by an etchback step, such as reactive ion etch. Alternatively, spacers can be formed from $SiO_2$. In one embodiment, the height of the spacers 80, 82 roughly approximates or exceeds the height of the gate electrode 64 and ranges from about 80 nm to about 250 nm. The widths of the spacers 80, 82 range from about 30 nm to about 100 nm. Spacer sidewalls 81, 83 proximate to the source/drain regions 68, 70 may have at least partially concave profile. Sidewalls 81, 83 intersect the surface of the substrate 62 at angles $\alpha$, $\beta$ that range from about 60° to about 90°. In a particular embodiment, the angles $\alpha$, $\beta$ substantially, but not necessarily precisely, equal 90°. Furthermore, in various embodiments of the fabrication methods according to the invention, it is not necessary to precisely control the liner oxide undercut beneath the silicon nitride spacer prior to epitaxial growth to minimize faceting. The spacers 80, 82 may be fabricated so that the sidewalls 81, 83 are substantially aligned with a particular crystallographic plane of the semiconductor substrate 62, such as, for example, the <100> or <110> crystallographic plane.

The raised source/drain regions 68, 70 are formed by selective epitaxial growth coupled with ion implantation after formation of sidewall spacers 80, 82, as described below. The height of the source/drain regions 68, 70 may range from about 10 nm to about 100 nm.

Figure 6:
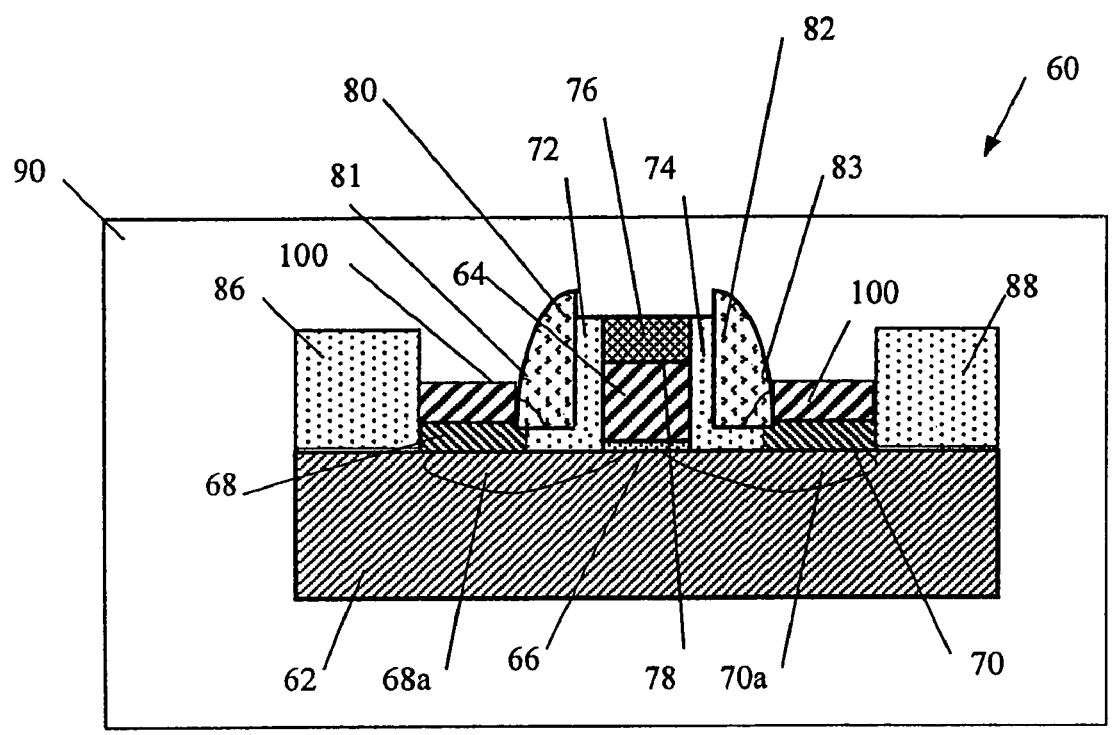
FIG. 6 depicts a cross-sectional view of the device of FIG. 5 after silicidation of the source/drain epitaxial layers.

Referring to FIG. 6, a contact material 100 is subsequently formed on raised source and drain regions 68, 70. In a particular embodiment, the contact material 100 is a metal compound that is thermally stable and has low electrical resistivity at the silicon/refractory metal interface, such as a metal silicide including, for example, cobalt, titanium, tungsten, molybdenum, platinum, nickel, or tantalum. Preferably, the contact material 90 is formed by a self-aligned silicide process, in which the contacts are formed only in the areas where the deposited metal is in direct contact with the source/drain regions 68, 70. Because of the facet-free formation, the metal uniformly penetrates the raised source 68 and drain 70 regions thereby maintaining the advantages of the raised source and drain approach.

In various embodiments of the invention, the raised source/drain elements 68, 70 include, for example, Si, Ge, or SiGe alloys, and are formed by selective epitaxial growth in a CVD system, such as LPCVD, APCVD, or PECVD reactor. Suitable CVD systems commonly used for volume epitaxy in manufacturing applications include, for example, EPI CENTURA™ single-wafer multi-chamber systems available from Applied Materials of Santa Clara, Calif., or EPSILON® single-wafer epitaxial reactors available from ASM International based in Bilthoven, The Netherlands.

In the CVD process, selective epitaxial growth typically includes introducing a source gas into the chamber. The source gas may include at least one precursor gas and a carrier gas, such as, for example hydrogen. In those embodiments of the invention where the raised regions 68, 70 are formed from Si, silicon precursor gases such as, for example, silane, disilane, trisilane, or dichlorosilane (DCS) are used. Conversely, in those embodiments of the invention where the raised regions 68, 70 are formed from Ge, germanium precursor gases, such as, for example, germane ($GeH_4$), digermane, germanium tetrachloride, or germanium dichloride are used. Finally, in the embodiments where the raised regions 68, 70 are formed from SiGe alloy, a combination of silicon and germanium precursor gases in various proportions is used. In a particular embodiment of the invention for selective deposition of $Si_{0.80}Ge_{0.20}$ layers, 100 standard cubic centimeters (sccm) of DCS, 25 sccm 10% $GeH_4/H_2$, and 150 sccm of HCl in a hydrogen carrier gas at a growth temperature of 750° C. and pressure of 20 Torr may be used. In another embodiment of the invention for selective deposition of Si layers, 100 sccm of DCS and 100 sccm of HCl in a hydrogen carrier gas at a growth temperature of 850° C. and pressure of 10 Torr may be used.

The LPCVD, APCVD, or PECVD system chamber is heated, such as, for example, by RF-heating. The growth temperature in the chamber ranges from about 300° C. to about 900° C. depending on the composition of the raised regions 68, 70. Specifically, if the source gas predominantly contains silicon precursor, the temperature preferably ranges from about 500 to about 900° C., and if the source gas predominantly contains germanium precursor, the temperature ranges from about 300° C. to about 700° C. The chamber pressure during formation of raised regions 68, 70 is greater than about 5 Torr and the growth rate is greater than 1 nanometer/minute (nm/min).

Referring again to FIG. 5, during selective epitaxial growth, the material composing raised regions 68, 70 forms only on the semiconductor substrate, such as the silicon substrate 62. The top surface 78 of gate electrode 64 is protected from epitaxial growth by the hard mask 76. Alternatively, hard mask 76 is absent from top surface 78 of gate electrode 64, and epitaxial growth additionally occurs on top surface 78. Epitaxy parameters are chosen such that substantially no epitaxial layer is formed on sidewall spacers 80, 82, and, as described below, substantially no facets are formed at the interface between raised regions 68, 70 and spacers 80, 82.

Selective growth of epitaxial layers substantially only on silicon or other semiconductors, and not on dielectrics such as silicon nitride or silicon dioxide, is facilitated by the introduction of an etchant, such as, for example, hydrogen chloride or chlorine, to the source gas mixture. Specifically, epitaxial layers are grown on exposed windows in a dielectric mask while nucleation of polysilicon on the masking material is suppressed during the incubation time by, for example, etching of spurious nuclei on the dielectric material, the mediation of saturation by formation of a number of intermediate chlorine-containing silicon precursors, and passivation of surface defect sites which serve as heterogeneous nucleation centers. Also, selectivity is facilitated by growing for a period of time that is generally shorter than the incubation period needed for polysilicon nucleation on the dielectric mask.

In various embodiments of the invention, the epitaxial layers of the source/drain regions 68, 70 are doped in situ by adding a dopant during deposition of the epitaxial layer to suppress facet formation at the interface with the spacers 80, 82. Examples of suitable dopants are n-type dopant such as phosphorus, arsenic, and antimony, or p-type dopant, such as boron. The dopant may be added to the epitaxial layer by introducing a dopant gas, such as phosphine, arsine, stibine, and diborane, into the chamber. The dopant gas is diluted in a carrier gas of the source gas mixture to, for example, approximately 1% concentration.

In a particular embodiment, facetless selective epitaxial growth according to the invention is compatible with CMOS fabrication. CMOS fabrication entails formation of a n-channel MOSFET ("NMOS") in a first portion of the semiconductor region; and a p-channel MOSFET ("PMOS") in a second portion of the semiconductor region so that both MOSFETs are disposed on the same substrate. Accordingly, in this embodiment, in situ doping that is used during the epitaxial growth to suppress facet formation is sufficiently low so that it will not interfere with introduction of additional dopants of opposite type ("counterdoping") that is necessary in order to manufacture both n-channel and p-channel MOSFETs on the same substrate. This counterdoping may be performed with suitable masking in place for either NMOS (if the in situ doping to suppress faceting was p-type) or PMOS (if the in situ doping to suppress faceting was n-type), thus allowing CMOS fabrication. Accordingly, in this embodiment of the invention, a level of in situ doping that is used during the epitaxial growth to suppress facet formation does not exceed the level of counterdoping (for example, ion implantation) that is necessary for CMOS fabrication. For example, in one variation of this embodiment, the level of in situ doping ranges from about $10^{17}$ to about $10^{19}$ cm$^{-3}$, which does not interfere with a typical doping level used during CMOS fabrication that usually exceeds about $10^{20}$ cm$^{-3}$.

Other embodiments incorporating the concepts disclosed herein may be used without departing from the spirit and scope of the invention. The described embodiments are to be considered in all respects as only illustrative and not restrictive. Therefore, it is intended that the scope of the invention be only limited by the following claims.

The invention claimed is:

1. A method of fabricating a semiconductor structure, the method comprising:
   providing a semiconductor substrate;
   forming a gate stack over a first portion of the semiconductor substrate, the gate stack comprising a dielectric and defining a channel therebelow; and
   selectively depositing an epitaxial layer comprising at least one semiconductor material proximate the gate stack while in situ doping the epitaxial layer to a first predetermined level, to thereby suppress formation of facets on the epitaxial layer, wherein an ambient pressure during selective deposition of the epitaxial layer is greater than about 5 Torr and the channel is strained.

2. The method of claim 1, wherein depositing the epitaxial layer comprises defining at least one of a source element and a drain element proximate the gate stack.

3. The method of claim 1, wherein the selective deposition of the epitaxial layer results in the formation of a substantially facetless semiconductor region.

4. The method of claim 1, wherein the epitaxial layer is deposited in a single-wafer reduced-pressure chemical vapor deposition system.

5. The method of claim 1, wherein the dielectric comprises a two-layered spacer structure comprising a silicon oxide liner and a silicon nitride spacer disposed thereon.

6. The method of claim 5, wherein the silicon oxide liner undercuts the silicon nitride spacer such that the silicon nitride spacer extends further laterally from the gate stack than the silicon oxide liner.

7. The method of claim 1, further comprising forming a contact material above the epitaxial layer, wherein the contact material comprises at least one material selected from the group consisting of nickel and tungsten.

8. The method of claim 7, wherein the contact material comprises nickel.

9. The method of claim 7, wherein the contact material comprises tungsten.

10. The method of claim 1, wherein the strained channel consists essentially of silicon.

11. The method of claim 10, wherein the epitaxial layer comprises silicon and germanium.

12. The method of claim 11, wherein the step of selectively depositing an epitaxial layer comprises use of at least one precursor gas, the at least one precursor gas comprising dichlorosilane and germane.

13. The method of claim 12, wherein the ambient pressure is less than approximately 20 Torr.

14. The method of claim 12, wherein an ambient temperature during the selective deposition of the epitaxial layer is selected from a range of 500° C. to about 900° C.

15. The method of claim 14, wherein the ambient temperature is approximately 750° C.

16. The method of claim 14, wherein the ambient temperature is approximately 700° C.

17. The method of claim 12, wherein the epitaxial layer extends to a height above the substrate ranging from about 10 nm to about 100 nm.

18. The method of claim 12, wherein the substrate comprises an insulating layer.

19. The method of claim 12, wherein the step of selectively depositing an epitaxial layer comprises use of a carrier gas, and the carrier gas comprises hydrogen.

20. The method of claim 19, wherein the carrier gas consists essentially of hydrogen.

21. The method of claim 12, wherein the step of selectively depositing an epitaxial layer comprises use of an etchant, and the etchant comprises at least one of hydrogen chloride and chlorine.

22. The method of claim 21, wherein the etchant comprises hydrogen chloride.

23. The method of claim 22, wherein the step of selectively depositing an epitaxial layer comprises use of a carrier gas, and the carrier gas consists essentially of hydrogen.

* * * * *